United States Patent
Kondo

(10) Patent No.: US 12,332,321 B2
(45) Date of Patent: Jun. 17, 2025

(54) LOAD TESTING DEVICE

(71) Applicant: TATSUMI RYOKI CO., LTD, Tokyo (JP)

(72) Inventor: Toyoshi Kondo, Tokyo (JP)

(73) Assignee: TATSUMI RYOKI CO., LTD, Tokyo (JP)

( * ) Notice: Subject to any disclaimer, the term of this patent is extended or adjusted under 35 U.S.C. 154(b) by 202 days.

(21) Appl. No.: 18/273,203

(22) PCT Filed: Jan. 31, 2022

(86) PCT No.: PCT/JP2022/003532
§ 371 (c)(1),
(2) Date: Jul. 19, 2023

(87) PCT Pub. No.: WO2022/181216
PCT Pub. Date: Sep. 1, 2022

(65) Prior Publication Data
US 2024/0027542 A1 Jan. 25, 2024

(30) Foreign Application Priority Data
Feb. 24, 2021 (JP) ................... 2021-027169

(51) Int. Cl.
*G01R 1/20* (2006.01)
*G01R 31/34* (2020.01)
*G01R 31/42* (2006.01)

(52) U.S. Cl.
CPC .......... *G01R 31/42* (2013.01); *G01R 1/203* (2013.01); *G01R 1/206* (2013.01); *G01R 31/343* (2013.01)

(58) Field of Classification Search
CPC ...... G01R 31/42; G01R 31/343; G01R 1/203; G01R 1/206
See application file for complete search history.

(56) References Cited

U.S. PATENT DOCUMENTS

2016/0299198 A1 10/2016 Kondo
2017/0184686 A1* 6/2017 Kondo .................. G01R 17/02
2020/0386813 A1* 12/2020 Kondo .................. G01R 31/34

FOREIGN PATENT DOCUMENTS

JP H09-15309 A 1/1997
JP 2000-121709 A 4/2000
(Continued)

OTHER PUBLICATIONS

International Search Report issued in PCT/JP2022/003532 mailed on Mar. 22, 2022 with English Translation (5 pages).
(Continued)

*Primary Examiner* — Dominic E Hawkins
(74) *Attorney, Agent, or Firm* — Nakanishi IP Associates, LLC

(57) ABSTRACT

A load testing device includes a terminal unit, a main relay unit, a resistance unit, and a housing. The main relay unit and the switch group are used to switch a connection state between the first R-phase resistor group and the second R-phase resistor group between series and parallel, switch a connection state between the first S-phase resistor group and the second S-phase resistor group between series and parallel, and switch a connection state between the first T-phase resistor group and the second T-phase resistor group between series and parallel. A first accommodation region to a third accommodation region are located between a fourth accommodation region and a fifth accommodation region. The second accommodation region is located between the first accommodation region and the third accommodation region. The first accommodation region accommodates the first R-phase resistor group and the second R-phase resistor group.

12 Claims, 18 Drawing Sheets

(56) References Cited

FOREIGN PATENT DOCUMENTS

| JP | 2010-25752 A | 2/2010 |
| WO | 2015/125181 A1 | 8/2015 |
| WO | 2019/176643 A1 | 9/2019 |

OTHER PUBLICATIONS

Written Opinion of International Searching Authority issued in PCT/JP2022/003532 mailed on Mar. 22, 2022 with English Translation (7 pages).

\* cited by examiner

LOAD TESTING DEVICE

TECHNICAL FIELD

The present invention relates to a load testing device.

BACKGROUND ART

Conventionally, as in Patent Literature 1, a load testing device that performs a load test of a three-phase AC generator has been proposed.

CITATION LIST

Patent Literature

Patent Literature 1: JPH 09-15309 A

SUMMARY OF INVENTION

Technical Problem

However, how a switch (relay) is disposed in a housing of the load testing device is not considered.

Therefore, an object of the present invention is to provide a load testing device that can cope with high-voltage and low-voltage test target power supplies and can easily wire a relay and a resistor group.

Solution to Problem

A load testing device according to the present invention includes a terminal unit connected to a test target power supply, a main relay unit, a resistance unit including a first R-phase resistor group, a second R-phase resistor group, a first S-phase resistor group, a second S-phase resistor group, a first T-phase resistor group, a second T-phase resistor group, and a switch group, and a housing that accommodates the terminal unit and the resistance unit.

Each of the first R-phase resistor group, the second R-phase resistor group, the first S-phase resistor group, the second S-phase resistor group, the first T-phase resistor group, and the second T-phase resistor group includes at least one resistor.

The main relay unit and the switch group are used to switch a connection state between the first R-phase resistor group and the second R-phase resistor group between series and parallel, switch a connection state between the first S-phase resistor group and the second S-phase resistor group between series and parallel, and switch a connection state between the first T-phase resistor group and the second T-phase resistor group between series and parallel.

Power from an R-phase terminal of the test target power supply is supplied to the first R-phase resistor group and the second R-phase resistor group via the terminal unit.

Power from an S-phase terminal of the test target power supply is supplied to the first S-phase resistor group and the second S-phase resistor group via the terminal unit.

Power from a T-phase terminal of the test target power supply is supplied to the first T-phase resistor group and the second T-phase resistor group via the terminal unit.

A first accommodation region, a second accommodation region, and a third accommodation region in the housing are located between a fourth accommodation region and a fifth accommodation region in the housing.

The second accommodation region is located between the first accommodation region and the third accommodation region.

The first accommodation region accommodates the first R-phase resistor group and the second R-phase resistor group.

The second accommodation region accommodates the first S-phase resistor group and the second S-phase resistor group.

The third accommodation region accommodates the first T-phase resistor group and the second T-phase resistor group.

The fourth accommodation region accommodates the terminal unit, a relay of the main relay unit, and some relays of the switch group.

The fifth accommodation region accommodates remaining relays of the switch group.

By switching the connection state between the two resistor groups (such as the first R-phase resistor group and the second R-phase resistor group) between series and parallel, it is easy to cope with a load test of a high-voltage test target power supply and a load test of a low-voltage test target power supply. Meanwhile, in order to switch the connection state between the resistor groups, it is necessary to prepare a plurality of relays and a switch group including a relay unit.

The regions (the first accommodation region to the third accommodation region) that accommodate the resistor group are sandwiched between the region (fourth accommodation region) that accommodates the relay of the main relay unit and some relays of the switch group and the region (fifth accommodation region) that accommodates the remaining relays of the switch group.

That is, the relays of the switch group are disposed on both sides of the regions (the first accommodation region to the third accommodation region) that accommodate said resistor group in a direction in which the regions that accommodate the resistor group are arranged.

Therefore, as compared with a form in which the relay of the switch group and the like is disposed on one side of the regions (the first accommodation region to the third accommodation region) that accommodate the resistor group, it is possible to easily wire a cable that connects the resistor of the resistor group and the relay, and the relay. Maintenance at the time of failure or the like is also facilitated.

Preferably, one terminal of the first R-phase resistor group and one terminal of the second R-phase resistor group are connected.

One terminal of the first S-phase resistor group and one terminal of the second S-phase resistor group are connected.

One terminal of the first T-phase resistor group and one terminal of the second T-phase resistor group are connected.

The remaining relays of the switch group include a relay for connecting one terminal of the first R-phase resistor group, one terminal of the first S-phase resistor group, and one terminal of the first T-phase resistor group when the first R-phase resistor group and the second R-phase resistor group are connected in parallel, the first S-phase resistor group and the second S-phase resistor group are connected in parallel, and the first T-phase resistor group and the second T-phase resistor group are connected in parallel.

More preferably, the main relay unit includes a relay for connecting the other terminal of the second R-phase resistor group, the other terminal of the second S-phase resistor group, and the other terminal of the second T-phase resistor group when the first R-phase resistor group and the second R-phase resistor group are connected in series, the first S-phase resistor group and the second S-phase resistor group are connected in series, and the first T-phase resistor group and the second T-phase resistor group are connected in series, and includes a relay for connecting the other terminal of the first R-phase resistor group and the other terminal of the second R-phase resistor group, connecting the other terminal of the first S-phase resistor group and the other terminal of the second S-phase resistor group, and connecting the other terminal of the first T-phase resistor group and the other terminal of the second T-phase resistor group.

More preferably, the fourth accommodation region, the first accommodation region, the second accommodation region, the third accommodation region, and the fifth accommodation region are arranged in a first direction.

A region that accommodates the first R-phase resistor group in the first accommodation region and a region that accommodates the second R-phase resistor group in the first accommodation region are arranged in a second direction perpendicular to the first direction.

A region that accommodates the first S-phase resistor group in the second accommodation region and a region that accommodates the second S-phase resistor group in the second accommodation region are arranged in the second direction.

A region that accommodates the first T-phase resistor group in the third accommodation region and a region that accommodates the second T-phase resistor group in the third accommodation region are arranged in the second direction.

Resistors of the first R-phase resistor group, the second R-phase resistor group, the first S-phase resistor group, the second S-phase resistor group, the first T-phase resistor group, and the second T-phase resistor group are disposed to extend in the first direction.

A cable length between the end of the resistor and the relay of the fourth accommodation region or the fifth accommodation region can be shortened and the wiring can be easily performed as compared with a form in which the resistor is disposed to extend in another direction.

Preferably, the fourth accommodation region, the first accommodation region, the second accommodation region, the third accommodation region, and the fifth accommodation region are arranged in a first direction.

A region that accommodates the first R-phase resistor group in the first accommodation region and a region that accommodates the second R-phase resistor group in the first accommodation region are arranged in a second direction perpendicular to the first direction.

A region that accommodates the first S-phase resistor group in the second accommodation region and a region that accommodates the second S-phase resistor group in the second accommodation region are arranged in the second direction.

A region that accommodates the first T-phase resistor group in the third accommodation region and a region that accommodates the second T-phase resistor group in the third accommodation region are arranged in the second direction.

Odd resistors of the first R-phase resistor group, the second R-phase resistor group, the first S-phase resistor group, the second S-phase resistor group, the first T-phase resistor group, and the second T-phase resistor group are connected in series and disposed to extend in the first direction.

The resistors of the first R-phase resistor group and the second R-phase resistor group are arranged in the second direction.

The resistors of the first S-phase resistor group and the second S-phase resistor group are arranged in the second direction.

The resistors of the first T-phase resistor group and the second T-phase resistor group are arranged in the second direction.

Preferably, the fourth accommodation region, the first accommodation region, the second accommodation region, the third accommodation region, and the fifth accommodation region are arranged in a first direction.

A region that accommodates the first R-phase resistor group in the first accommodation region and a region that accommodates the second R-phase resistor group in the first accommodation region are arranged in a second direction perpendicular to the first direction.

A region that accommodates the first S-phase resistor group in the second accommodation region and a region that accommodates the second S-phase resistor group in the second accommodation region are arranged in the second direction.

A region that accommodates the first T-phase resistor group in the third accommodation region and a region that accommodates the second T-phase resistor group in the third accommodation region are arranged in the second direction.

Odd resistors of the first R-phase resistor group, the second R-phase resistor group, the first S-phase resistor group, the second S-phase resistor group, the first T-phase resistor group, and the second T-phase resistor group are connected in series and disposed to extend in the second direction.

The resistors of the first R-phase resistor group and the second R-phase resistor group are arranged in the first direction.

The resistors of the first S-phase resistor group and the second S-phase resistor group are arranged in the first direction.

The resistors of the first T-phase resistor group and the second T-phase resistor group are arranged in the first direction.

As compared with the case where even resistors are connected in series, the terminal of the resistor closer to the fourth accommodation region can be easily wired with the relay of the fourth accommodation region, and the terminal of the resistor closer to the fifth accommodation region can be easily wired with the relay of the fifth accommodation region.

A load testing device according to the present invention includes: a terminal unit connected to a test target power supply; a main relay unit; a first resistance unit including a 11th R-phase resistor group, a 12th R-phase resistor group, a 11th S-phase resistor group, a 12th S-phase resistor group, a 11th T-phase resistor group, a 12th T-phase resistor group, and a first switch group; a second resistance unit including a 21st R-phase resistor group, a 22nd R-phase resistor group, a 21st S-phase resistor group, a 22nd S-phase resistor group, a 21st T-phase resistor group, a 22nd T-phase resistor group, and a second switch group; and a housing that accommodates the terminal unit, the first resistance unit, and the second resistance unit.

Each of the 11th R-phase resistor group, the 12th R-phase resistor group, the 11th S-phase resistor group, the 12th S-phase resistor group, the 11th T-phase resistor group, the 12th T-phase resistor group, the 21st R-phase resistor group, the 22nd R-phase resistor group, the 21st S-phase resistor group, the 22nd S-phase resistor group, the 21st T-phase resistor group, and the 22nd T-phase resistor group includes at least one resistor.

The main relay unit and the first switch group are used to switch a connection state between the 11th R-phase resistor group and the 12th R-phase resistor group between series and parallel, switch a connection state between the 11th S-phase resistor group and the 12th S-phase resistor group between series and parallel, and switch a connection state between the 11th T-phase resistor group and the 12th T-phase resistor group between series and parallel.

The main relay unit and the second switch group are used to switch a connection state between the 21st R-phase resistor group and the 22nd R-phase resistor group between series and parallel, switch a connection state between the 21st S-phase resistor group and the 22nd S-phase resistor group between series and parallel, and switch a connection state between the 21st T-phase resistor group and the 22nd T-phase resistor group between series and parallel.

Power from an R-phase terminal of the test target power supply is supplied to the 11th R-phase resistor group, the 12th R-phase resistor group, the 21st R-phase resistor group, and the 22nd R-phase resistor group via the terminal unit.

Power from an S-phase terminal of the test target power supply is supplied to the 11th S-phase resistor group, the 12th S-phase resistor group, the 21st S-phase resistor group, and the 22nd S-phase resistor group via the terminal unit.

Power from a T-phase terminal of the test target power supply is supplied to the 11th T-phase resistor group, the 12th T-phase resistor group, the 21st T-phase resistor group, and the 22nd T-phase resistor group via the terminal unit.

A first accommodation region, a second accommodation region, and a third accommodation region in the housing are located between a fourth accommodation region and a fifth accommodation region in the housing.

The second accommodation region is located between the first accommodation region and the third accommodation region.

The first accommodation region accommodates the 11th R-phase resistor group, the 12th R-phase resistor group, the 21st R-phase resistor group, and the 22nd R-phase resistor group.

The second accommodation region accommodates the 11th S-phase resistor group, the 12th S-phase resistor group, the 21st S-phase resistor group, and the 22nd S-phase resistor group.

The third accommodation region accommodates the 11th T-phase resistor group, the 12th T-phase resistor group, the 21st T-phase resistor group, and the 22nd T-phase resistor group.

The fourth accommodation region accommodates the terminal unit, the main relay unit, at least some relays of the first switch group, and at least some relays of the second switch group.

The fifth accommodation region accommodates at least one of remaining relays of the first switch group and remaining relays of the second switch group.

Preferably, one terminal of the 11th R-phase resistor group and one terminal of the 12 the R-phase resistor group are connected.

One terminal of the 11th S-phase resistor group and one terminal of the 12th S-phase resistor group are connected.

One terminal of the 11th T-phase resistor group and one terminal of the 12th T-phase resistor group are connected.

One terminal of the 21st R-phase resistor group and one terminal of the 22nd R-phase resistor group are connected.

One terminal of the 21st S-phase resistor group and one terminal of the 22nd S-phase resistor group are connected.

One terminal of the 21st T-phase resistor group and one terminal of the 22nd T-phase resistor group are connected.

The remaining relays of the first switch group include a relay for connecting one terminal of the 11th R-phase resistor group, one terminal of the 11th S-phase resistor group, and one terminal of the 11th T-phase resistor group when the 11th R-phase resistor group and the 12th R-phase resistor group are connected in parallel, the 11th S-phase resistor group and the 12th S-phase resistor group are connected in parallel, and the 11th T-phase resistor group and the 12th T-phase resistor group are connected in parallel.

The remaining relays of the second switch group include a relay for connecting one terminal of the 21st R-phase resistor group, one terminal of the 21st S-phase resistor group, and one terminal of the 21st T-phase resistor group when the 21st R-phase resistor group and the 22nd R-phase resistor group are connected in parallel, the 21st S-phase resistor group and the 22nd S-phase resistor group are connected in parallel, and the 21st T-phase resistor group and the 22nd T-phase resistor group are connected in parallel.

More preferably, a connection state between the 11th R-phase resistor group and the 12th R-phase resistor group, a connection state between the 11th S-phase resistor group and the 12th S-phase resistor group, and a connection state between the 11th T-phase resistor group and the 12th T-phase resistor group are switched in a state where power supply from the test target power supply to the first resistance unit via the terminal unit is not performed.

A connection state between the 21st R-phase resistor group and the 22nd R-phase resistor group, a connection state between the 21st S-phase resistor group and the 22nd S-phase resistor group, and a connection state between the 21st T-phase resistor group and the 22nd T-phase resistor group are switched in a state where power supply from the test target power supply to the second resistance unit via the terminal unit is not performed.

Since the relay is switched in a state where the power supply is cut off, it is possible to prevent power supply to a resistor group or the like to which power should not be erroneously supplied.

Preferably, one terminal of the 11th R-phase resistor group and one terminal of the 12th R-phase resistor group are connected.

One terminal of the 11th S-phase resistor group and one terminal of the 12th S-phase resistor group are connected.

One terminal of the 11th T-phase resistor group and one terminal of the 12th T-phase resistor group are connected.

One terminal of the 21st R-phase resistor group and one terminal of the 22nd R-phase resistor group are connected.

One terminal of the 21st S-phase resistor group and one terminal of the 22nd S-phase resistor group are connected.

One terminal of the 21st T-phase resistor group and one terminal of the 22nd T-phase resistor group are connected.

At least one of the remaining relays of the first switch group and the remaining relays of the second switch group which is accommodated in the fifth accommodation region, includes a relay for connecting one terminal of the 11th R-phase resistor group, one terminal of the 11th S-phase resistor group, and one terminal of the 11th T-phase resistor group, and for connecting one terminal of the 21st R-phase resistor group, one terminal of the 21st S-phase resistor group, and one terminal of the 21st T-phase resistor group when the 11th R-phase resistor group and the 12th R-phase resistor group are connected in parallel, the 11th S-phase resistor group and the 12th S-phase resistor group are connected in parallel, the 11th T-phase resistor group and the 12th T-phase resistor group are connected in parallel, the 21st R-phase resistor group and the 22nd R-phase resistor group are connected in parallel, the 21st S-phase resistor group and the 22nd S-phase resistor group are connected in parallel, and the 21st T-phase resistor group and the 22nd T-phase resistor group are connected in parallel.

More preferably, when the 11th R-phase resistor group and the 12th R-phase resistor group are connected in parallel, the 11th S-phase resistor group and the 12th S-phase resistor group are connected in parallel, the 11th T-phase resistor group and the 12th T-phase resistor group are connected in parallel, the 21st R-phase resistor group and the 22nd R-phase resistor group are connected in parallel, the 21st S-phase resistor group and the 22nd S-phase resistor group are connected in parallel, and the 21st T-phase resistor group and the 22nd T-phase resistor group are connected in parallel, the main relay unit includes a relay for connecting the other terminal of the 11th R-phase resistor group and the other terminal of the 12th R-phase resistor group, connecting the other terminal of the 11th S-phase resistor group and the other terminal of the 12th S-phase resistor group, connecting the other terminal of the 11th T-phase resistor group and the other terminal of the 12th T-phase resistor group, connecting the other terminal of the 21st R-phase resistor group and the other terminal of the 22nd R-phase resistor group, connecting the other terminal of the 21st S-phase resistor group and the other terminal of the 22nd S-phase resistor group, and connecting the other terminal of the 21st T-phase resistor group and the other terminal of the 22nd T-phase resistor group.

When the 11th R-phase resistor group and the 12th R-phase resistor group are connected in series, the 11th S-phase resistor group and the 12th S-phase resistor group are connected in series, the 11th T-phase resistor group and the 12th T-phase resistor group are connected in series, the 21st R-phase resistor group and the 22nd R-phase resistor group are connected in series, the 21st S-phase resistor group and the 22nd S-phase resistor group are connected in series, and the 21st T-phase resistor group and the 22nd T-phase resistor group are connected in series, the main relay unit includes a relay for connecting the other terminal of the 12th R-phase resistor group, the other terminal of the 12th S-phase resistor group, the other terminal of the 12th T-phase resistor group, the other terminal of the 22nd R-phase resistor group, the other terminal of the 22nd S-phase resistor group, and the other terminal of the 22nd T-phase resistor group.

By sharing a short-circuit relay for neutral point connection of star connection, the number of relays can be reduced as compared with a form in which a short-circuit relay for neutral point connection in the first resistance unit and a short-circuit relay for neutral point connection in the second resistance unit are separately provided.

More preferably, a connection state between the 11th R-phase resistor group and the 12th R-phase resistor group, a connection state between the 11th S-phase resistor group and the 12th S-phase resistor group, a connection state between the 11th T-phase resistor group and the 12th T-phase resistor group, a connection state between the 21st R-phase resistor group and the 22nd R-phase resistor group, a connection state between the 21st S-phase resistor group and the 22nd S-phase resistor group, and a connection state between the 21st T-phase resistor group and the 22nd T-phase resistor group are switched in a state where power is not supplied from the test target power supply to the first resistance unit and the second resistance unit via the terminal unit.

Advantageous Effects of Invention

As described above, according to the present invention, it is possible to provide a load testing device that can cope with high-voltage and low-voltage test target power supplies and can easily wire a switch and a resistor group.

DESCRIPTION OF EMBODIMENTS

Figure 1:
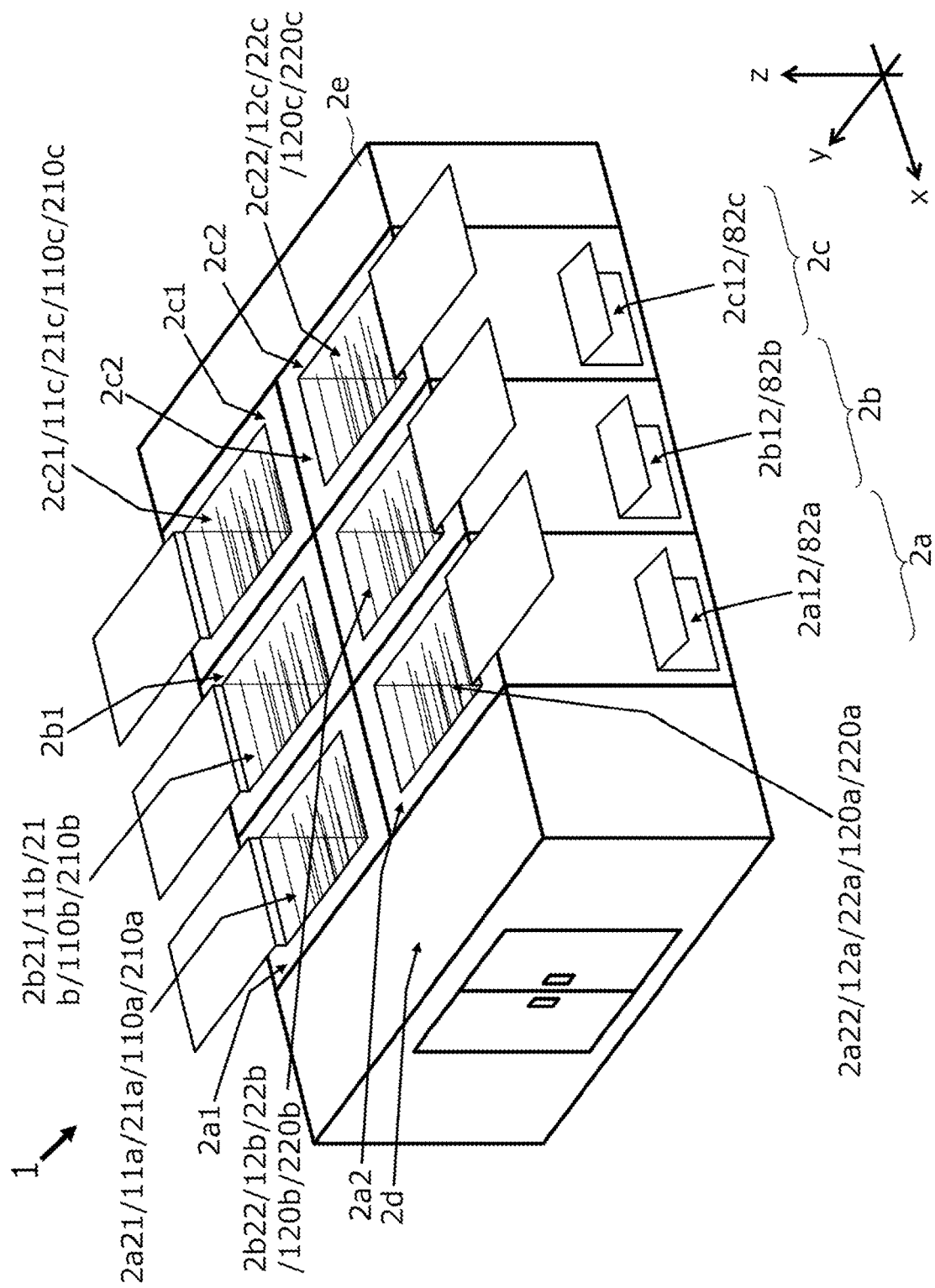
FIG. 1 is a perspective view of a load testing device in a first embodiment.
Figure 2:
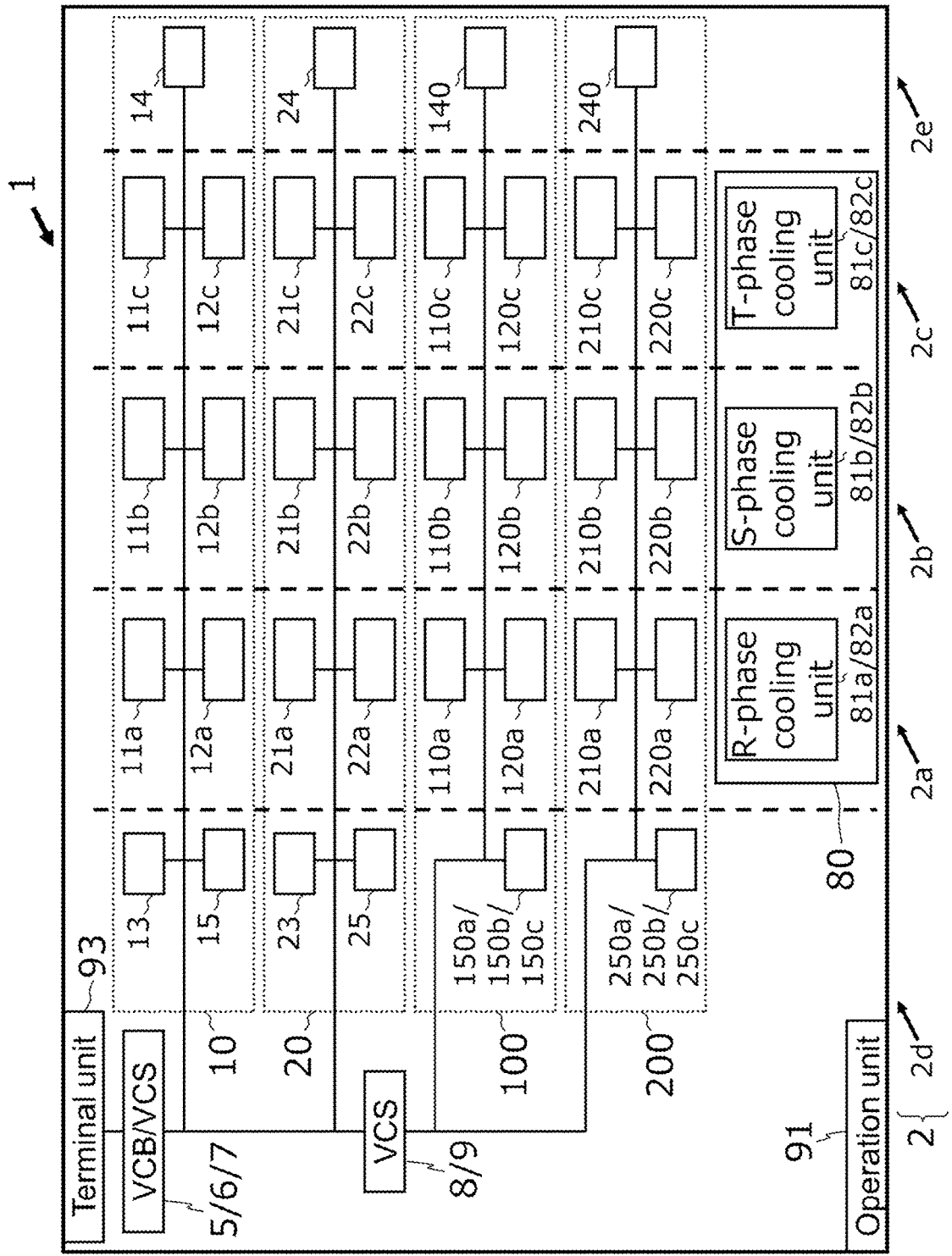
FIG. 2 is a schematic view illustrating the configuration of the load testing device in the first embodiment.

Hereinafter, a first embodiment will be described with reference to the drawings.

The embodiments are not limited to the following embodiments. The contents described in one embodiment are similarly applied also to other embodiments in principle. The embodiments and modifications can be combined as appropriate.

A dry load testing device 1 according to the first embodiment includes a housing 2, a main relay unit (a first main relay unit 5, a second main relay unit 6, and a third main relay unit 7), a first fine-adjustment relay unit 8, a second fine-adjustment relay unit 9, a first resistance unit 10, a second resistance unit 20, a 10th resistance unit 100, a 20th resistance unit 200, a cooling unit 80, an operation unit 91, and a terminal unit 93 (see FIGS. 1 to 13).

In order to describe directions, a horizontal direction (front-rear direction) in which a first accommodation region 2a and a second accommodation region 2b of the housing 2 are arranged is described as an x direction, a horizontal direction (left-right direction) perpendicular to the x direction is described as a y direction, and a vertical direction perpendicular to the x direction and the y direction is described as a z direction. In FIG. 1, FIGS. 3 to 5, and FIG. 15 of a second embodiment, directions indicated by arrows of xyz axes are respectively defined as a front direction, a right direction, and an upward direction.

Figure 3:
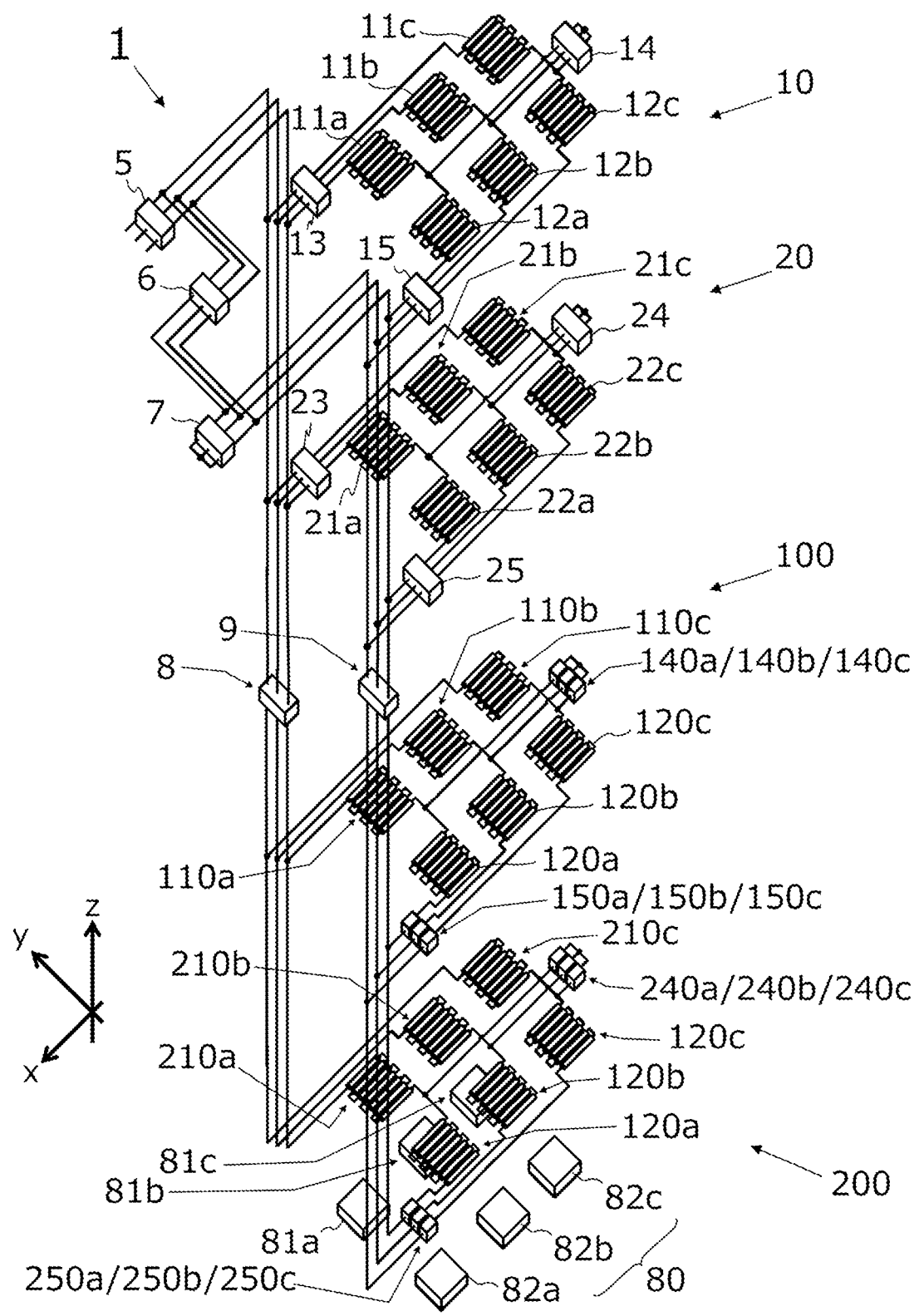
FIG. 3 is a perspective view illustrating a first main relay unit to a third main relay unit, a first resistance unit, a second resistance unit, a 10th resistance unit, a resistance unit, and a cooling unit in the first embodiment.
Figure 4:
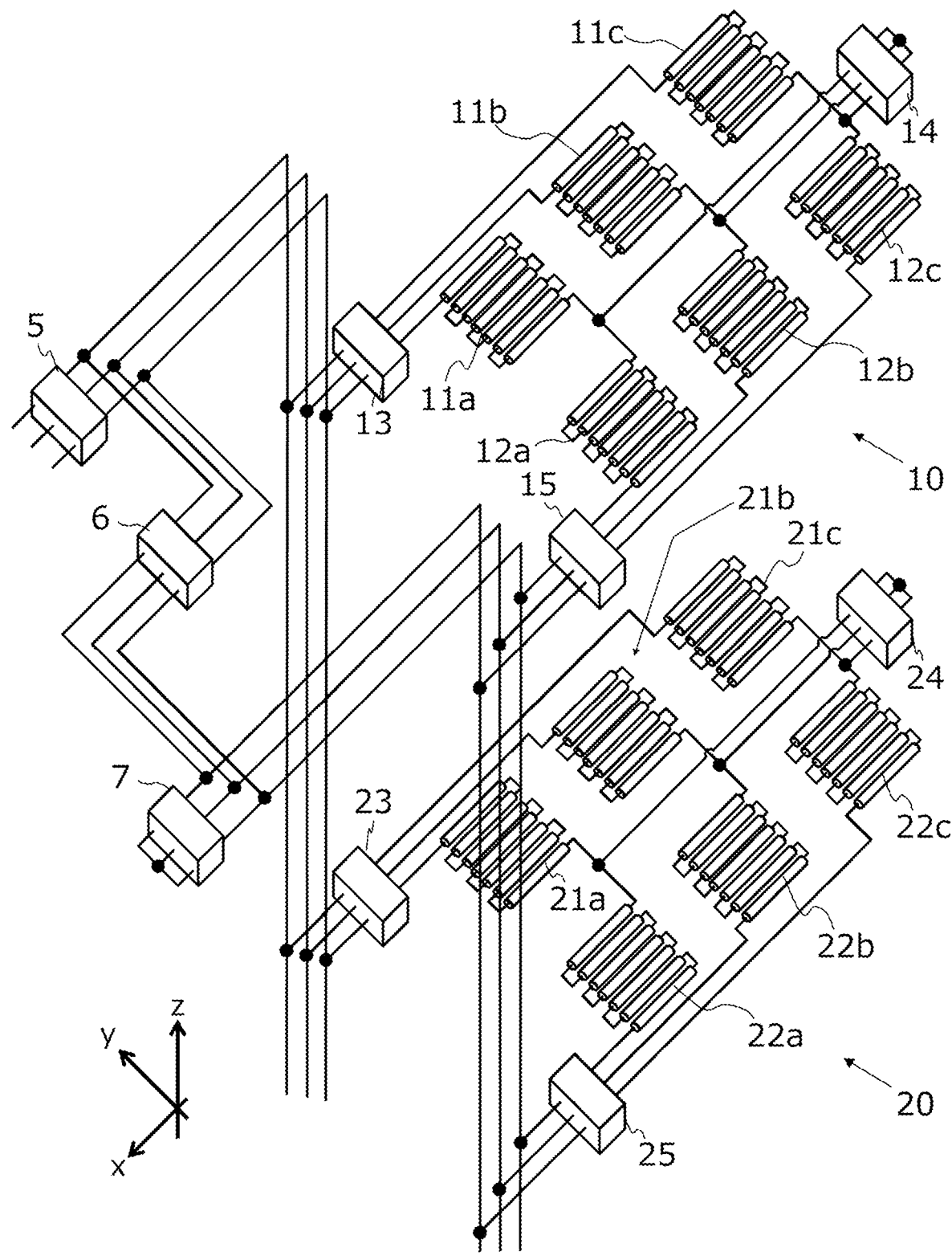
FIG. 4 is an enlarged perspective view of a region including the first main relay unit to the third main relay unit, the first resistance unit, and the second resistance unit in FIG. 3.
Figure 5:
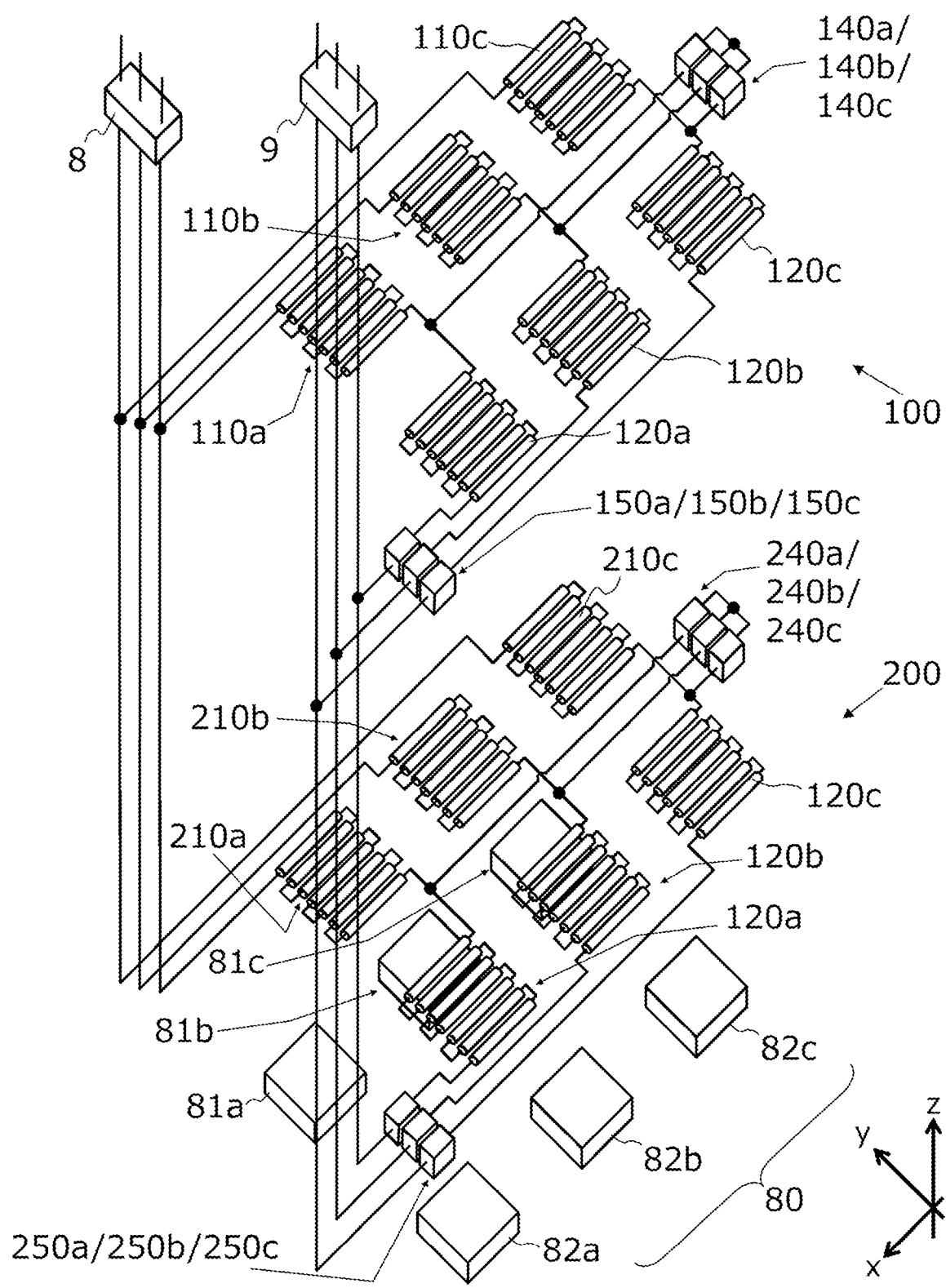
FIG. 5 is an enlarged perspective view of a region including the 10th resistance unit, the 20th resistance unit, and the cooling unit in FIG. 3.

FIGS. 3 to 5 illustrate the configurations of the first resistance unit 10, the second resistance unit 20, the 10th resistance unit 100, and the 20th resistance unit 200 in a state where an interval in the z direction is increased.

Figure 15:
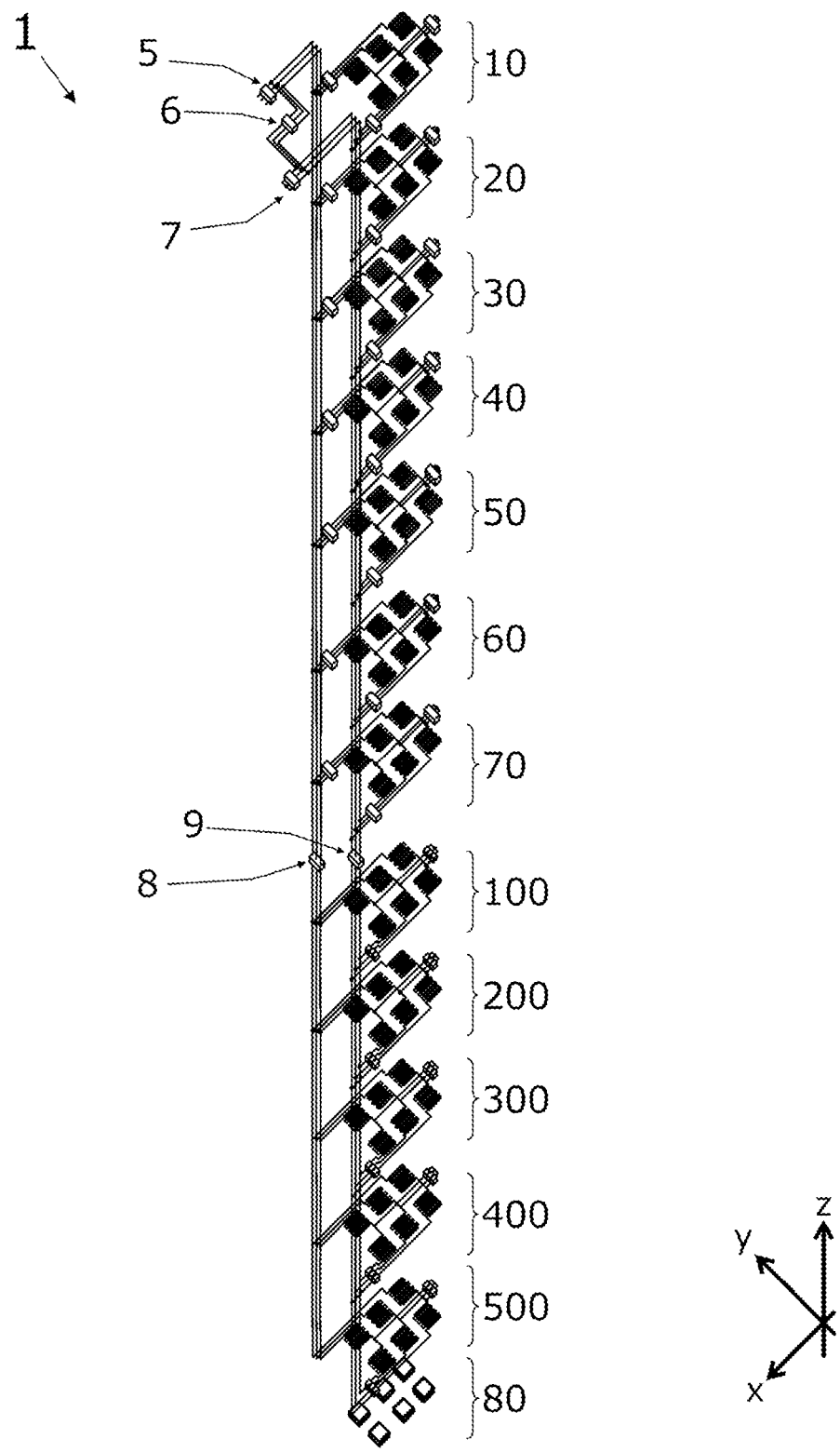
FIG. 15 is a perspective view illustrating a first main relay unit to a third main relay unit, a first resistance unit to a seventh resistance unit, a 10th resistance unit to a 50th resistance unit, and a cooling unit in the second embodiment.
Figure 16:
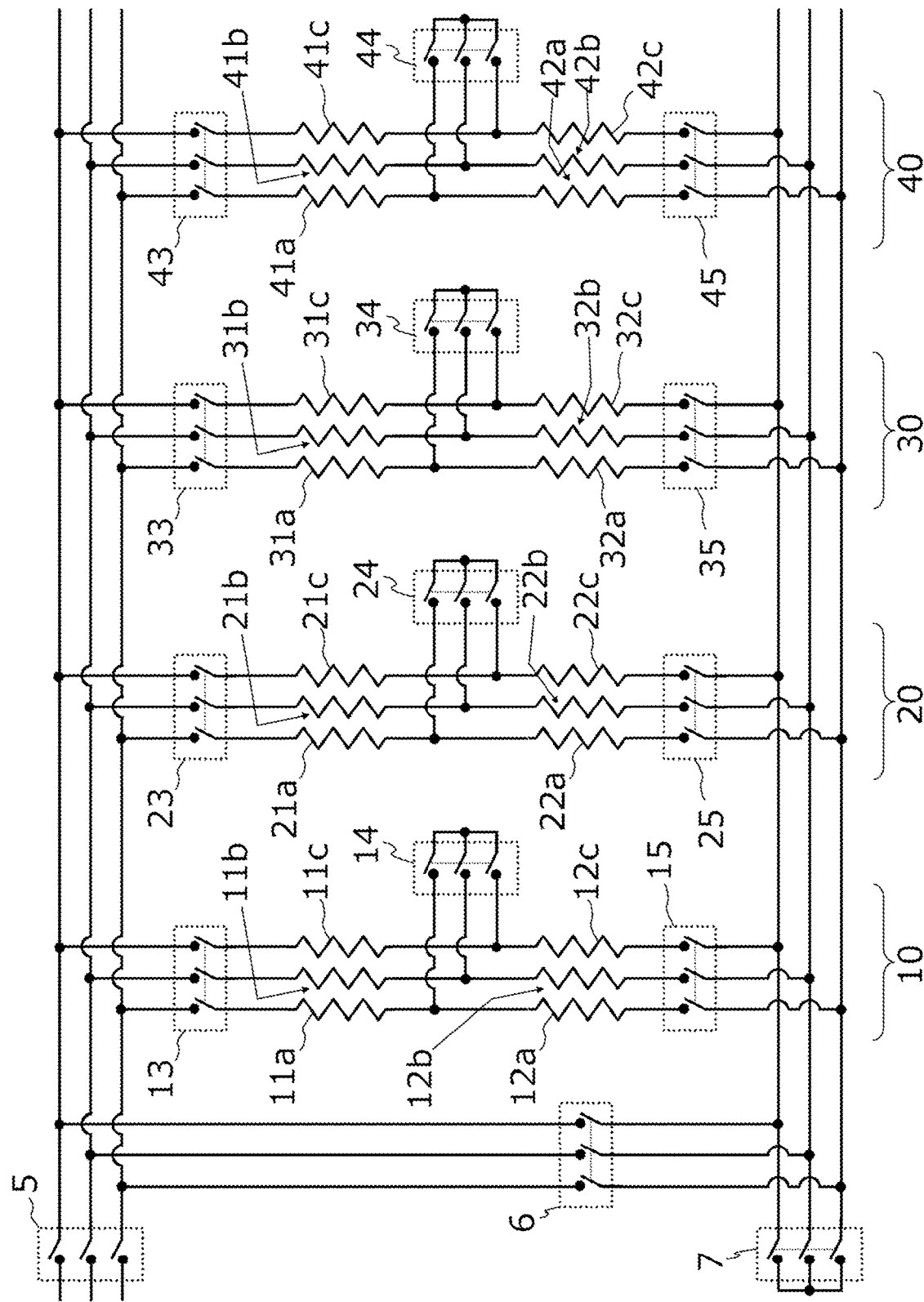
FIG. 16 is a circuit diagram of the first resistance unit to the fourth resistance unit in the second embodiment.
Figure 17:
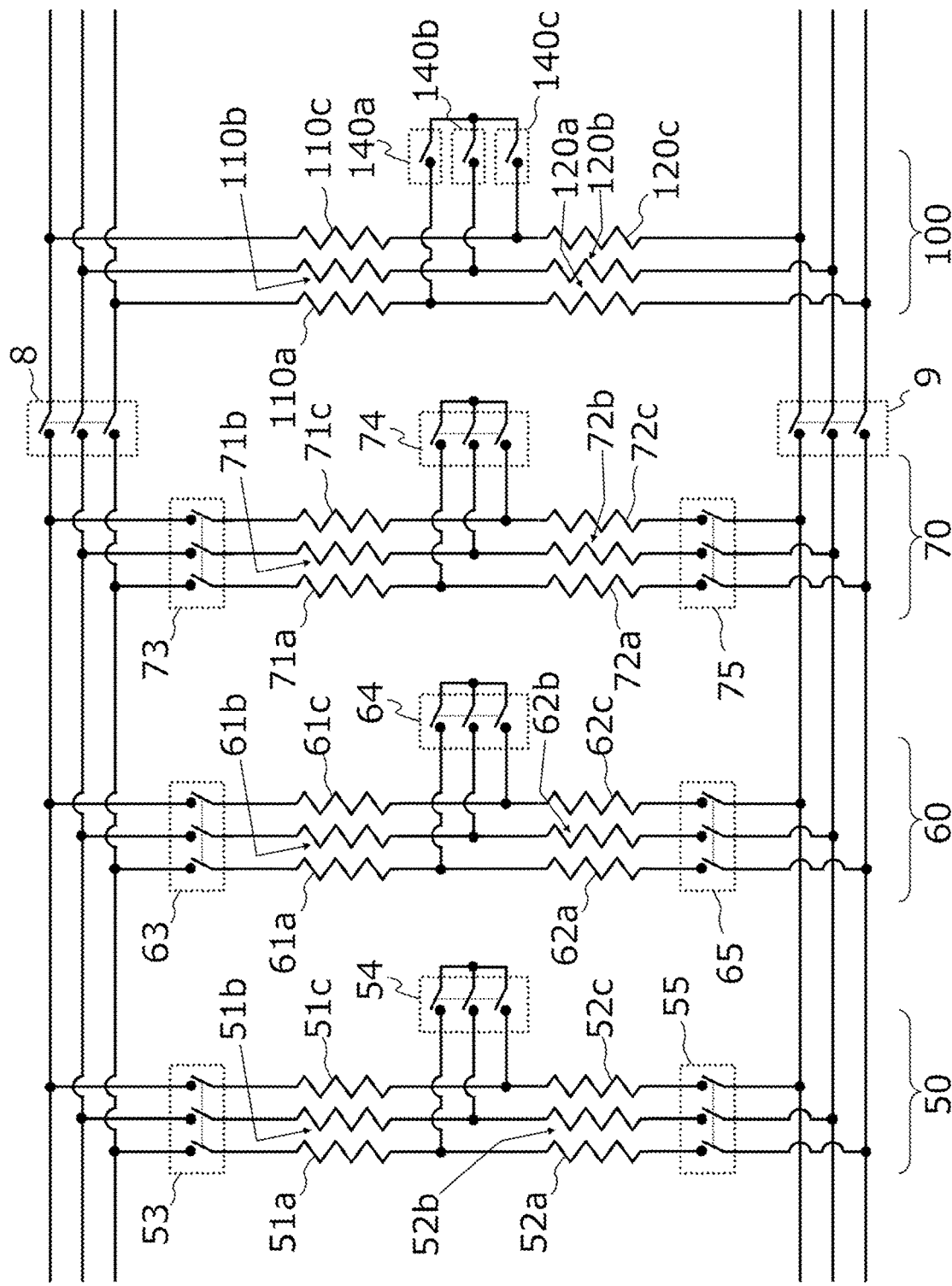
FIG. 17 is a circuit diagram of the fifth resistance unit to the seventh resistance unit, and the 10th resistance unit in the second embodiment.
Figure 18:
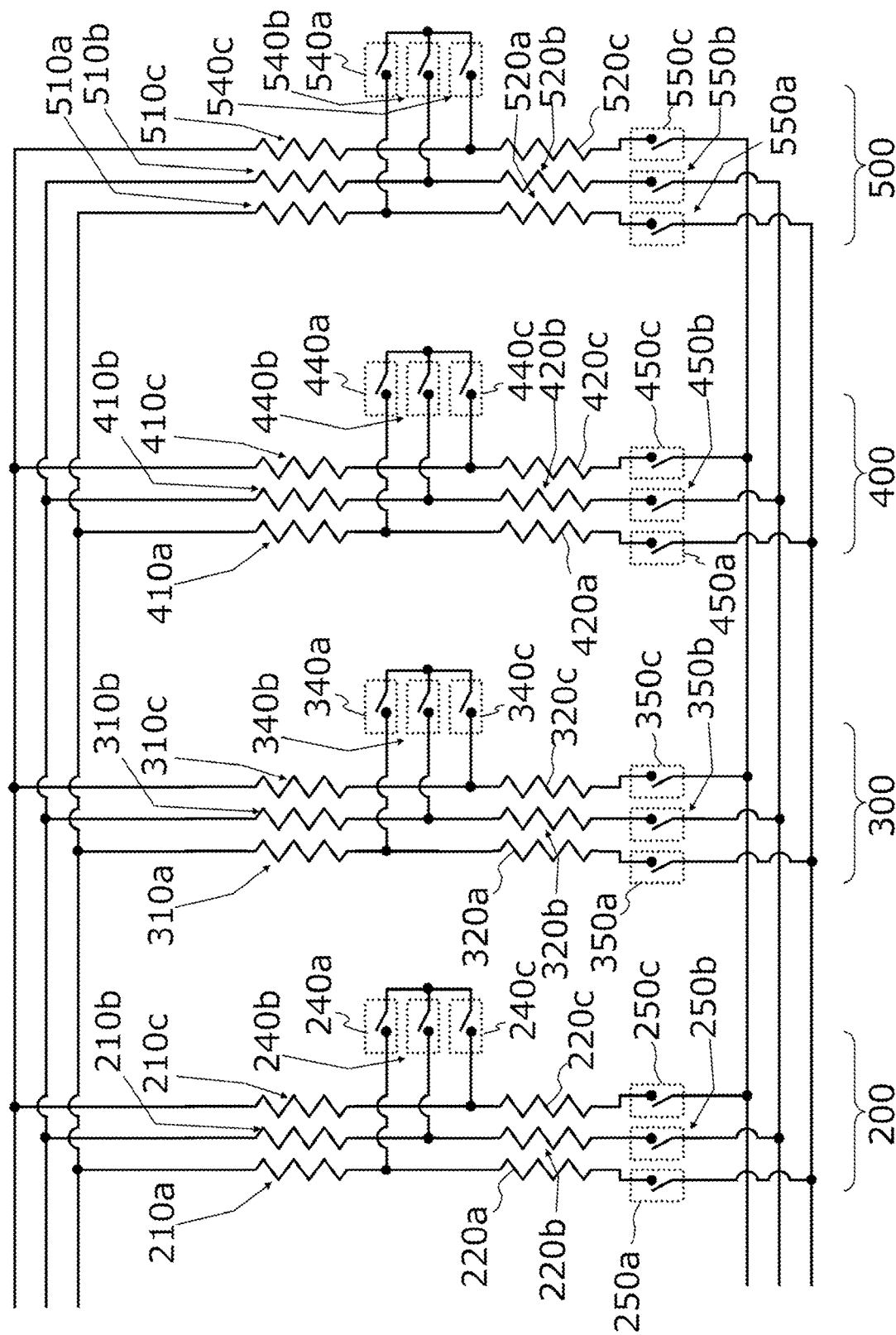
FIG. 18 is a circuit diagram of the 20th resistance unit to the 50th resistance unit in the second embodiment.

FIG. 15 of the second embodiment illustrates the configurations of the first resistance unit 10 to the seventh resistance unit 70, and the 10th resistance unit 100 to the 50th resistance unit 500 in a state where an interval in the z direction is increased.

(Housing 2)

The housing 2 accommodates the first main relay unit 5, the second main relay unit 6, the third main relay unit 7, the first fine-adjustment relay unit 8, the second fine-adjustment relay unit 9, the first resistance unit 10, the second resistance unit 20, the 10th resistance unit 100, the 20th resistance unit 200, the cooling unit 80, the operation unit 91, and the terminal unit 93.

The housing 2 has the first accommodation region 2a, the second accommodation region 2b, a third accommodation region 2c, a fourth accommodation region 2d, and a fifth accommodation region 2e (see FIGS. 1 to 5).

The fourth accommodation region 2d, the first accommodation region 2a, the second accommodation region 2b, the third accommodation region 2c, and the fifth accommodation region 2e are arranged from the front side in the x direction.

That is, the first accommodation region 2a, the second accommodation region 2b, and the third accommodation region 2c in the housing 2 are located between the fourth accommodation region 2d and the fifth accommodation region 2e in the housing 2.

The second accommodation region 2b is located between the first accommodation region 2a and the third accommodation region 2c.

(First Accommodation Region 2a)

The first accommodation region (R-phase resistor group accommodation region) 2a has a 11th accommodation region 2a1 and a 12th accommodation region 2a2.

The 12th accommodation region 2a2 is provided on the left side in the y direction of the 11th accommodation region 2a1.

The 11th accommodation region (first R-phase resistor group accommodation region) 2a1 accommodates a 11th R-phase resistor group 11a of the first resistance unit 10, a 21st R-phase resistor group 21a of the second resistance unit a 110th R-phase resistor group 110a of the 10th resistance unit 100, and a 210th R-phase resistor group 210a of the 20th resistance unit 200 in the upper stage, and accommodates a first R-phase cooling unit 81a of the cooling unit 80 in the lower stage.

The 12th accommodation region (second R-phase resistor group accommodation region) 2a2 accommodates a 12th R-phase resistor group 12a of the first resistance unit 10, a 22nd R-phase resistor group 22a of the second resistance unit a 120th R-phase resistor group 120a of the 10th resistance unit 100, and a 220th R-phase resistor group 220a of the 20th resistance unit 200 in the upper stage, and accommodates a second R-phase cooling unit 82a of the cooling unit 80 in the lower stage.

A first R-phase intake port 2a11 (not illustrated) is provided in the lower part of the 11th accommodation region 2a1.

A second R-phase intake port 2a12 is provided in the lower part of the 12th accommodation region 2a2.

A first R-phase exhaust port 2a21 is provided in the upper part of the 11th accommodation region 2a1.

A second R-phase exhaust port 2a22 is provided in the upper part of the 12th accommodation region 2a2.

Air taken in from the first R-phase intake port 2a11 by the first R-phase cooling unit 81a of the cooling unit 80 cools the 210th R-phase resistor group 210a, the 110th R-phase resistor group 110a, the 21st R-phase resistor group 21a, and the 11th R-phase resistor group 11a, and is discharged via the first R-phase exhaust port 2a21.

Air taken in from the second R-phase intake port 2a12 by the second R-phase cooling unit 82a of the cooling unit 80 cools the 220th R-phase resistor group 220a, the 120th R-phase resistor group 120a, the 22nd R-phase resistor group 22a, and the 12th R-phase resistor group 12a, and is discharged via the second R-phase exhaust port 2a22.

Each of the first R-phase intake port 2a11, the second R-phase intake port 2a12, the first R-phase exhaust port 2a21, and the second R-phase exhaust port 2a22 is provided with a lid that closes when not in use, that is, when a load test is not performed. However, these lids may be omitted.

The second accommodation region (S-phase resistor group accommodation region) 2b has a 21st accommodation region 2b1 and a 22nd accommodation region 2b2.

The 22nd accommodation region 2b2 is provided on the left side in the y direction of the 21st accommodation region 2b1.

The 21st accommodation region (first S-phase resistor group accommodation region) 2b1 accommodates a 11th S-phase resistor group 11b of the first resistance unit 10, a 21st S-phase resistor group 21b of the second resistance unit a 110th S-phase resistor group 110b of the 10th resistance unit 100, and a 210th S-phase resistor group 210b of the 20th resistance unit 200 in the upper stage, and accommodates a first S-phase cooling unit 81*b* of the cooling unit 80 in the lower stage.

The 22nd accommodation region (second S-phase resistor group accommodation region) 2*b*2 accommodates a 12th S-phase resistor group 12*b* of the first resistance unit 10, a 22nd S-phase resistor group 22*b* of the second resistance unit a 120th S-phase resistor group 120*b* of the 10th resistance unit 100, and a 220th S-phase resistor group 220*b* of the 20th resistance unit 200 in the upper stage, and accommodates a second S-phase cooling unit 82*b* of the cooling unit 80 in the lower stage.

A first S-phase intake port 2*b*11 (not illustrated) is provided in the lower part of the 21st accommodation region 2*b*1.

A second S-phase intake port 2*b*12 is provided in the lower part of the 22nd accommodation region 2*b*2.

A first S-phase exhaust port 2*b*21 is provided in the upper part of the 21st accommodation region 2*b*1.

A second S-phase exhaust port 2*b*22 is provided in the upper part of the 22nd accommodation region 2*b*2.

Air taken in from the first S-phase intake port 2*b*11 by the first S-phase cooling unit 81*b* of the cooling unit 80 cools the 210th S-phase resistor group 210*b*, the 110th S-phase resistor group 110*b*, the 21st S-phase resistor group 21*b*, and the 11th S-phase resistor group 11*b*, and is discharged via the first S-phase exhaust port 2*b*21.

Air taken in from the second S-phase intake port 2*b*12 by the second S-phase cooling unit 82*b* of the cooling unit cools the 220th S-phase resistor group 220*b*, the 120th S-phase resistor group 120*b*, the 22nd S-phase resistor group 22*b*, and the 12th S-phase resistor group 12*b*, and is discharged via the second S-phase exhaust port 2*b*22.

Each of the first S-phase intake port 2*b*11, the second S-phase intake port 2*b*12, the first S-phase exhaust port 2*b*21, and the second S-phase exhaust port 2*b*22 is provided with a lid that closes when not in use, that is, when a load test is not performed. However, these lids may be omitted.

The third accommodation region (T-phase resistor group accommodation region) 2*c* has a 31st accommodation region 2*c*1 and a 32nd accommodation region 2*c*2.

The 32nd accommodation region 2*c*2 is provided on the left side in the y direction of the 31st accommodation region 2*c*1.

The 31st accommodation region (first T-phase resistor group accommodation region) 2*c*1 accommodates a 11th T-phase resistor group 11*c* of the first resistance unit 10, a 21st T-phase resistor group 21*c* of the second resistance unit 20, a 110th T-phase resistor group 110*c* of the 10th resistance unit 100, and a 210th T-phase resistor group 210*c* of the 20th resistance unit 200 in the upper stage, and accommodates a first T-phase cooling unit 81*c* of the cooling unit 80 in the lower stage.

The 32nd accommodation region (second T-phase resistor group accommodation region) 2*c*2 accommodates a 12th T-phase resistor group 12*c* of the first resistance unit 10, a 22nd T-phase resistor group 22*c* of the second resistance unit 20, a 120th T-phase resistor group 120*c* of the 10th resistance unit 100, and a 220th T-phase resistor group 220*c* of the 20th resistance unit 200 in the upper stage, and accommodates a second T-phase cooling unit 82*c* of the cooling unit 80 in the lower stage.

A first T-phase intake port 2*c*11 (not illustrated) is provided in the lower part of the 31st accommodation region 2*c*1.

A second T-phase intake port 2*c*12 is provided in the lower part of the 32nd accommodation region 2*c*2.

A first T-phase exhaust port 2*c*21 is provided in the upper part of the 31st accommodation region 2*c*1.

A second T-phase exhaust port 2*c*22 is provided in the upper part of the 32nd accommodation region 2*c*2.

Air taken in from the first T-phase intake port 2*c*11 by the first T-phase cooling unit 81*c* of the cooling unit 80 cools the 210th T-phase resistor group 210*c*, the 110th T-phase resistor group 110*c*, the 21st T-phase resistor group 21*c*, and the 11th T-phase resistor group 11*c*, and is discharged via the first T-phase exhaust port 2*c*21.

Air taken in from the second T-phase intake port 2*c*12 by the second T-phase cooling unit 82*c* of the cooling unit 80 cools the 220th T-phase resistor group 220*c*, the 120th T-phase resistor group 120*c*, the 22nd T-phase resistor group 22*c*, and the 12th T-phase resistor group 12*c*, and is discharged via the second T-phase exhaust port 2*c*22.

Each of the first T-phase intake port 2*c*11, the second T-phase intake port 2*c*12, the first T-phase exhaust port 2*c*21, and the second T-phase exhaust port 2*c*22 is provided with a lid that closes when not in use, that is, when a load test is not performed. However, these lids may be omitted.

The 11th accommodation region 2*a*1, the 21st accommodation region 2*b*1, and the 31st accommodation region 2*c*1 are arranged in the x direction.

The 12th accommodation region 2*a*2, the 22nd accommodation region 2*b*2, and the 32nd accommodation region 2*c*2 are arranged in the x direction.

The 11th accommodation region 2*a*1 and the 12th accommodation region 2*a*2 may be configured integrally or separately.

The 21st accommodation region 2*b*1 and the 22nd accommodation region 2*b*2 may be configured integrally or separately.

The 31st accommodation region 2*c*1 and the 32nd accommodation region 2*c*2 may be configured integrally or separately.

The fourth accommodation region 2*d* accommodates the first main relay unit 5, the second main relay unit 6, the third main relay unit 7, the first fine-adjustment relay unit 8, the second fine-adjustment relay unit 9, a 13th relay unit 13 and a 15th relay unit 15 of the first resistance unit 10, a 23rd relay unit 23 and a 25th relay unit 25 of the second resistance unit 20, a 150th R-phase relay 150*a*, a 150th S-phase relay 150*b* and a 150th T-phase relay 150*c* of the 10th resistance unit 100, a 250th R-phase relay 250*a*, a 250th S-phase relay 250*b* and a 250th T-phase relay 250*c* of the 20th resistance unit 200, the operation unit 91, and the terminal unit 93.

The fifth accommodation region 2*e* accommodates a 14th relay unit 14 of the first resistance unit 10, a 24th relay unit 24 of the second resistance unit 20, a 140th R-phase relay 140*a*, a 140th S-phase relay 140*b* and a 140th T-phase relay 140*c* of the 10th resistance unit 100, and a 240th R-phase relay 240*a*, a 240th S-phase relay 240*b*, and a 240th T-phase relay 240*c* of the 20th resistance unit 200.

(First Main Relay Unit 5)

Figure 6:
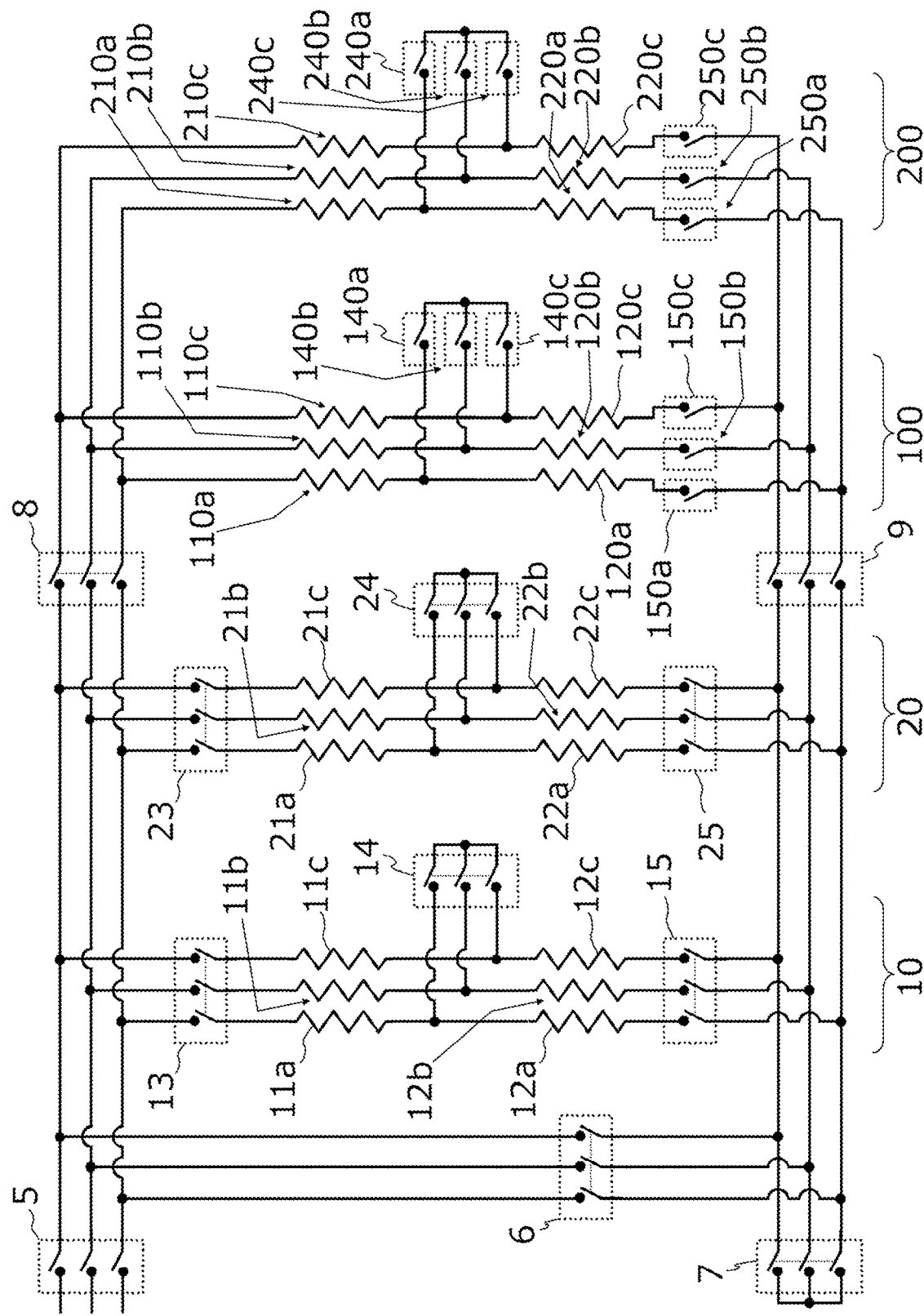
FIG. 6 is a circuit diagram of a first resistance unit, a second resistance unit, a 10th resistance unit, and a resistance unit.

The first main relay unit 5 includes a vacuum circuit breaker (VCB), and is used to control on/off of power supply from the test target power supply to the first resistance unit 10, the second resistance unit 20, the 10th resistance unit 100, and the 20th resistance unit 200 (see FIG. 6).

One R-phase terminal of the first main relay unit 5 is connected to an R-phase terminal of the test target power supply via the terminal unit 93.

The other R-phase terminal of the first main relay unit is connected to one R-phase terminal of the second main relay unit 6, one R-phase terminal of the first fine-adjustment relay unit 8, one R-phase terminal of the 13th relay unit 13, and one R-phase terminal of the 23rd relay unit 23.

One S-phase terminal of the first main relay unit 5 is connected to an S-phase terminal of the test target power supply via the terminal unit 93.

The other S-phase terminal of the first main relay unit is connected to one S-phase terminal of the second main relay unit 6, one S-phase terminal of the first fine-adjustment relay unit 8, one S-phase terminal of the 13th relay unit 13, and one S-phase terminal of the 23rd relay unit 23.

One T-phase terminal of the first main relay unit 5 is connected to a T-phase terminal of the test target power supply via the terminal unit 93.

The other T-phase terminal of the first main relay unit 5 is connected to one T-phase terminal of the second main relay unit 6, one T-phase terminal of the first fine-adjustment relay unit 8, one T-phase terminal of the 13th relay unit 13, and one T-phase terminal of the 23rd relay unit 23.

(Second Main Relay Unit 6)

The second main relay unit 6 includes a triple magnetic contactor (VCS: Vacuum Circuit Switch). The second main relay unit 6 is used to connect resistor groups adjacent in the y direction, such as the 11th R-phase resistor group 11*a* and the 12th R-phase resistor group 12*a*, in parallel.

One R-phase terminal of the second main relay unit 6 is connected to the other R-phase terminal of the first main relay unit 5, or the like.

The other R-phase terminal of the second main relay unit 6 is connected to one R-phase terminal of the third main relay unit 7, one R-phase terminal of the second fine-adjustment relay unit 9, one R-phase terminal of the 15th relay unit 15, and one R-phase terminal of the 25th relay unit 25.

One S-phase terminal of the second main relay unit 6 is connected to the other S-phase terminal of the first main relay unit 5, or the like.

The other S-phase terminal of the second main relay unit 6 is connected to one S-phase terminal of the third main relay unit 7, one S-phase terminal of the second fine-adjustment relay unit 9, one S-phase terminal of the 15th relay unit 15, and one S-phase terminal of the 25th relay unit 25.

One T-phase terminal of the second main relay unit 6 is connected to the other T-phase terminal of the first main relay unit 5, or the like.

The other T-phase terminal of the second main relay unit 6 is connected to one T-phase terminal of the third main relay unit 7, one T-phase terminal of the second fine-adjustment relay unit 9, one T-phase terminal of the 15th relay unit 15, and one T-phase terminal of the 25th relay unit 25.

(Third Main Relay Unit 7)

The third main relay unit 7 includes a triple magnetic contactor (VCS: Vacuum Circuit Switch). The third main relay unit 7 is used for neutral point connection when resistor groups adjacent in the y direction, such as the 11th R-phase resistor group 11*a* and the 12th R-phase resistor group 12*a*, are connected in series.

One R-phase terminal of the third main relay unit 7 is connected to the other R-phase terminal of the second main relay unit 6, or the like.

One S-phase terminal of the third main relay unit 7 is connected to the other S-phase terminal of the second main relay unit 6, or the like.

One T-phase terminal of the third main relay unit 7 is connected to the other T-phase terminal of the second main relay unit 6, or the like.

The other R-phase terminal of the third main relay unit 7, the other S-phase terminal of the third main relay unit 7, and the other T-phase terminal of the third main relay unit 7 are short-circuited.

(Interlocking Switching Control of Second Main Relay Unit 6 and Third Main Relay Unit 7)

It is necessary to prevent power from the test target power supply from being supplied to the third main relay unit 7 via the second main relay unit 6. Therefore, it is desirable to perform control that enables switching of the third main relay unit 7 to an on state (disable switching of the third main relay unit 7 to the on state when the second main relay unit 6 is in the on state) only when the second main relay unit 6 is in an off state. Before the third main relay unit 7 is switched to the on state, the second main relay unit 6 may be controlled to be in the off state.

(First Fine-Adjustment Relay Unit 8, Second Fine-Adjustment Relay Unit 9)

The first fine-adjustment relay unit 8 and the second fine-adjustment relay unit 9 include a triple magnetic contactor (VCS: Vacuum Circuit Switch). The first fine-adjustment relay unit 8 and the second fine-adjustment relay unit 9 are used for fine-adjustment of a load amount, that is, for on/off control of power supply from the test target power supply to the 10th resistance unit 100 and the 20th resistance unit 200.

One R-phase terminal of the first fine-adjustment relay unit 8 is connected to the other R-phase terminal of the first main relay unit 5, or the like.

The other R-phase terminal of the first fine-adjustment relay unit 8 is connected to the other terminal of the 110th R-phase resistor group 110*a* and the other terminal of the 210th R-phase resistor group 210*a*. One terminal of the 110th R-phase resistor group 110*a* is connected to one terminal of the 120th R-phase resistor group 120*a*.

One S-phase terminal of the first fine-adjustment relay unit 8 is connected to the other S-phase terminal of the first main relay unit 5, or the like.

The other S-phase terminal of the first fine-adjustment relay unit 8 is connected to the other terminal of the 110th S-phase resistor group 110*b* and the other terminal of the 210th S-phase resistor group 210*b*. One terminal of the 110th S-phase resistor group 110*b* is connected to one terminal of the 120th S-phase resistor group 120*b*.

One T-phase terminal of the first fine-adjustment relay unit 8 is connected to the other T-phase terminal of the first main relay unit 5, or the like.

The other T-phase terminal of the first fine-adjustment relay unit 8 is connected to the other terminal of the 110th T-phase resistor group 110*c* and the other terminal of the 210th T-phase resistor group 210*c*. One terminal of the 110th T-phase resistor group 110*c* is connected to one terminal of the 120th T-phase resistor group 120*c*.

One R-phase terminal of the second fine-adjustment relay unit 9 is connected to the other R-phase terminal of the second main relay unit 6, or the like.

The other R-phase terminal of the second fine-adjustment relay unit 9 is connected to one terminal of the 150th R-phase relay 150*a* and one terminal of the 250th R-phase relay 250*a*.

One S-phase terminal of the second fine-adjustment relay unit 9 is connected to the other S-phase terminal of the second main relay unit 6, or the like.

The other S-phase terminal of the second fine-adjustment relay unit 9 is connected to one terminal of the 150th S-phase relay 150*b* and one terminal of the 250th S-phase relay 250*b*.

One T-phase terminal of the second fine-adjustment relay unit 9 is connected to the other T-phase terminal of the second main relay unit 6, or the like.

The other T-phase terminal of the second fine-adjustment relay unit 9 is connected to one terminal of the 150th T-phase relay 150c and one terminal of the 250th T-phase relay 250c.

Next, the configurations of the first resistance unit the second resistance unit 20, the 10th resistance unit 100, and the 20th resistance unit 200 will be described.

The first resistance unit 10 and the second resistance unit 20 are used as a main load in a load test.

The 10th resistance unit 100 and the 20th resistance unit 200 are used for fine-adjustment of a load amount in a load test.

As the resistor group of the 10th resistance unit 100 and the 20th resistance unit 200, one having a smaller capacitance than that of the resistor group of the first resistance unit 10 and the second resistance unit 20 is used.

(First Resistance Unit 10)

The first resistance unit 10 has the 11th R-phase resistor group 11a, the 11th S-phase resistor group 11b, the 11th T-phase resistor group 11c, the 12th R-phase resistor group 12a, the 12th S-phase resistor group 12b, the 12th T-phase resistor group 12c, and the first switch group (the 13th relay unit 13, the 14th relay unit 14, the 15th relay unit 15).

The 11th R-phase resistor group 11a includes a resistor row in which a plurality of rod-shaped resistors R parallel to the x direction are arranged at predetermined intervals in the y direction.

The 12th R-phase resistor group 12a includes a resistor row in which a plurality of rod-shaped resistors R parallel to the x direction are arranged at predetermined intervals in the y direction.

The 12th R-phase resistor group 12a is provided on the left side in the y direction of the 11th R-phase resistor group 11a.

One terminal of the 11th R-phase resistor group 11a is connected to one terminal of the 12th R-phase resistor group 12a.

The 11th R-phase resistor group 11a and the 12th R-phase resistor group 12a are used to perform an R-phase load test of a test target power supply such as a three-phase AC generator connected via the first main relay unit 5, the second main relay unit 6, the third main relay unit 7, and the first switch group.

The 11th R-phase resistor group 11a and the 12th R-phase resistor group 12a are connected in a state of being switchable between series and parallel depending on the operation states of the second main relay unit 6, the third main relay unit 7, and the 14th relay unit 14.

The resistors R of the 11th R-phase resistor group 11a and the 12th R-phase resistor group 12a generate heat by receiving power supply from the test target power supply as a dummy load for the load test.

In the first embodiment, an example is shown in which each of the 11th R-phase resistor group 11a and the 12th R-phase resistor group 12a has a plurality of resistors R, but each of the groups may be configured by one resistor R.

For example, when the third main relay unit 7 is turned on and the second main relay unit 6 and the 14th relay unit 14 are turned off, the 11th R-phase resistor group 11a and the 12th R-phase resistor group 12a are connected in series.

When the third main relay unit 7 is turned off and the second main relay unit 6 and the 14th relay unit 14 are turned on, the 11th R-phase resistor group 11a and the 12th R-phase resistor group 12a are connected in parallel.

The 11th S-phase resistor group 11b includes a resistor row in which a plurality of rod-shaped resistors R parallel to the x direction are arranged at predetermined intervals in the y direction.

The 12th S-phase resistor group 12b includes a resistor row in which a plurality of rod-shaped resistors R parallel to the x direction are arranged at predetermined intervals in the y direction.

The 12th S-phase resistor group 12b is provided on the left side in the y direction of the 11th S-phase resistor group 11b.

One terminal of the 11th S-phase resistor group 11b is connected to one terminal of the 12th S-phase resistor group 12b.

The 11th S-phase resistor group 11b is located behind the 11th R-phase resistor group 11a in the x direction.

The 12th S-phase resistor group 12b is located behind the 12th R-phase resistor group 12a in the x direction.

The 11th S-phase resistor group 11b and the 12th S-phase resistor group 12b are used to perform an S-phase load test of a test target power supply such as a three-phase AC generator connected via the first main relay unit the second main relay unit 6, the third main relay unit 7, and the first switch group.

The 11th S-phase resistor group 11b and the 12th S-phase resistor group 12b are connected in a state of being switchable between series and parallel depending on the operation states of the second main relay unit 6, the third main relay unit 7, and the 14th relay unit 14.

The resistors R of the 11th S-phase resistor group 11b and the 12th S-phase resistor group 12b generate heat by receiving power supply from the test target power supply as a dummy load for the load test.

In the first embodiment, an example is shown in which each of the 11th S-phase resistor group 11b and the 12th S-phase resistor group 12b has a plurality of resistors R, but each of the groups may be configured by one resistor R.

For example, when the third main relay unit 7 is turned on and the second main relay unit 6 and the 14th relay unit 14 are turned off, the 11th S-phase resistor group 11b and the 12th S-phase resistor group 12b are connected in series.

When the third main relay unit 7 is turned off and the second main relay unit 6 and the 14th relay unit 14 are turned on, the 11th S-phase resistor group 11b and the 12th S-phase resistor group 12b are connected in parallel.

The 11th T-phase resistor group 11c includes a resistor row in which a plurality of rod-shaped resistors R parallel to the x direction are arranged at predetermined intervals in the y direction.

The 12th T-phase resistor group 12c includes a resistor row in which a plurality of rod-shaped resistors R parallel to the x direction are arranged at predetermined intervals in the y direction.

The 12th T-phase resistor group 12c is provided on the left side in the y direction of the 11th T-phase resistor group 11c.

One terminal of the 11th T-phase resistor group 11c is connected to one terminal of the 12th T-phase resistor group 12c.

The 11th T-phase resistor group 11c is located behind the 11th S-phase resistor group 11b in the x direction.

The 12th T-phase resistor group 12c is located behind the 12th S-phase resistor group 12b in the x direction.

The 11th T-phase resistor group 11c and the 12th T-phase resistor group 12c are used to perform a T-phase load test of a test target power supply such as a three-phase AC generator connected via the first main relay unit 5, the second main relay unit 6, the third main relay unit 7, and the first switch group.

The 11th T-phase resistor group 11$c$ and the 12th T-phase resistor group 12$c$ are connected in a state of being switchable between series and parallel depending on the operation states of the second main relay unit 6, the third main relay unit 7, and the 14th relay unit 14.

The resistors R of the 11th T-phase resistor group 11$c$ and the 12th T-phase resistor group 12$c$ generate heat by receiving power supply from the test target power supply as a dummy load for the load test.

In the first embodiment, an example is shown in which each of the 11th T-phase resistor group 11$c$ and the 12th T-phase resistor group 12$c$ has a plurality of resistors R, but each of the groups may be configured by one resistor R.

For example, when the third main relay unit 7 is turned on and the second main relay unit 6 and the 14th relay unit 14 are turned off, the 11th T-phase resistor group 11$c$ and the 12th T-phase resistor group 12$c$ are connected in series.

When the third main relay unit 7 is turned off and the second main relay unit 6 and the 14th relay unit 14 are turned on, the 11th T-phase resistor group 11$c$ and the 12th T-phase resistor group 12$c$ are connected in parallel.

In the first embodiment, the resistors R of the 11th R-phase resistor group 11$a$, the 12th R-phase resistor group 12$a$, the 11th S-phase resistor group 11$b$, the 12th S-phase resistor group 12$b$, the 11th T-phase resistor group 11$c$, and the 12th T-phase resistor group 12$c$ extend in the x direction (first direction). The resistors R of the 11th R-phase resistor group 11$a$ and the 12th R-phase resistor group 12$a$ are arranged in the y direction (second direction). The resistors R of the 11th S-phase resistor group 11$b$ and the 12th S-phase resistor group 12$b$ are arranged in the y direction (second direction). The resistors R of the 11th T-phase resistor group 11$c$ and the 12th T-phase resistor group 12$c$ are arranged in the y direction (second direction).

However, the resistors R of the 11th R-phase resistor group 11$a$, the 12th R-phase resistor group 12$a$, the 11th S-phase resistor group 11$b$, the 12th S-phase resistor group 12$b$, the 11th T-phase resistor group 11$c$, and the 12th T-phase resistor group 12$c$ may extend in the y direction (second direction). In this case, the resistors R of the 11th R-phase resistor group 11$a$ and the 12th R-phase resistor group 12$a$ are arranged in the x direction (first direction). The resistors R of the 11th S-phase resistor group 11$b$ and the 12th S-phase resistor group 12$b$ are arranged in the x direction (first direction). The resistors R of the 11th T-phase resistor group 11$c$ and the 12th T-phase resistor group 12$c$ are arranged in the x direction (first direction).

The 13th relay unit 13 and the 15th relay unit 15 include a triple magnetic contactor (VCS: Vacuum Circuit Switch). The 13th relay unit 13 and the 15th relay unit are used to control on/off of power supply from the first main relay unit 5 to the 11th R-phase resistor group 11$a$, the 11th S-phase resistor group 11$b$, the 11th T-phase resistor group 11$c$, the 12th R-phase resistor group 12$a$, the 12th S-phase resistor group 12$b$, and the 12th T-phase resistor group 12$c$.

One R-phase terminal of the 13th relay unit 13 is connected to the other R-phase terminal of the first main relay unit 5, or the like.

The other R-phase terminal of the 13th relay unit 13 is connected to the other terminal of the 11th R-phase resistor group 11$a$.

One S-phase terminal of the 13th relay unit 13 is connected to the other S-phase terminal of the first main relay unit 5, or the like.

The other S-phase terminal of the 13th relay unit 13 is connected to the other terminal of the 11th S-phase resistor group 11$b$.

One T-phase terminal of the 13th relay unit 13 is connected to the other T-phase terminal of the first main relay unit 5, or the like.

The other T-phase terminal of the 13th relay unit 13 is connected to the other terminal of the 11th T-phase resistor group 11$c$.

One R-phase terminal of the 15th relay unit 15 is connected to the other R-phase terminal of the second main relay unit 6, or the like.

The other R-phase terminal of the 15th relay unit 15 is connected to the other terminal of the 12th R-phase resistor group 12$a$.

One S-phase terminal of the 15th relay unit 15 is connected to the other S-phase terminal of the second main relay unit 6, or the like.

The other S-phase terminal of the 15th relay unit 15 is connected to the other terminal of the 12th S-phase resistor group 12$b$.

One T-phase terminal of the 15th relay unit 15 is connected to the other T-phase terminal of the second main relay unit 6, or the like.

The other T-phase terminal of the 15th relay unit 15 is connected to the other terminal of the 12th T-phase resistor group 12$c$.

The 14th relay unit 14 includes a triple magnetic contactor (VCS: Vacuum Circuit Switch). The 14th relay unit 14 is used for neutral point connection when the 11th R-phase resistor group 11$a$ and the 12th R-phase resistor group 12$a$ are connected in parallel, the 11th S-phase resistor group 11$b$ and the 12th S-phase resistor group 12$b$ are connected in parallel, and the 11th T-phase resistor group 11$c$ and the 12th T-phase resistor group 12$c$ are connected in parallel.

That is, the 14th relay unit 14 is used to control on/off of short-circuiting of one terminal of the 11th R-phase resistor group 11$a$, one terminal of the 11th S-phase resistor group 11$b$, and one terminal of the 11th T-phase resistor group 11$c$.

One R-phase terminal of the 14th relay unit 14 is connected to one terminal of the 11th R-phase resistor group 11$a$ and one terminal of the 12th R-phase resistor group 12$a$.

One S-phase terminal of the 14th relay unit 14 is connected to one terminal of the 11th S-phase resistor group 11$b$ and one terminal of the 12th S-phase resistor group 12$b$.

One T-phase terminal of the 14th relay unit 14 is connected to one terminal of the 11th T-phase resistor group 11$c$ and one terminal of the 12th T-phase resistor group 12$c$.

The other R-phase terminal of the 14th relay unit 14, the other S-phase terminal of the 14th relay unit 14, and the other T-phase terminal of the 14th relay unit 14 are short-circuited.

A cable connecting the relay (such as the 13th relay unit 13) accommodated in the fourth accommodation region 2$d$ and the resistor group (such as the 11th T-phase resistor group 11$c$) accommodated in the 11th accommodation region 2$a$1, the 21st accommodation region 2$b$1, and the 31st accommodation region 2$c$1 is desirably provided outside said resistor group, on the opposite side of a region including the 12th accommodation region 2$a$2, the 22nd accommodation region 2$b$2, and the 32nd accommodation region 2$c$2 when viewed from the z direction.

A cable connecting the relay (such as the 15th relay unit 15) accommodated in the fourth accommodation region 2$d$ and the resistor group (such as the 12th T-phase resistor group 12$c$) accommodated in the 12th accommodation region 2$a$2, the 22nd accommodation region 2$b$2, and the 32nd accommodation region 2c2 is desirably provided outside said resistor group, on the opposite side of a region including the 11th accommodation region 2a1, the 21st accommodation region 2b1, and the 31st accommodation region 2c1 when viewed from the z direction.

A cable connecting the relay (such as the 14th relay unit 14) accommodated in the fifth accommodation region 2e and the resistor group (such as the 11th R-phase resistor group 11a) accommodated in the 11th accommodation region 2a1, the 21st accommodation region 2b1, the 31st accommodation region 2c1, the 12th accommodation region 2a2, the 22nd accommodation region 2b2, and the 32nd accommodation region 2c2 is desirably provided between the resistor group (such as the 11th T-phase resistor group 11c) on the right side in the y direction and the resistor group (such as the 12th T-phase resistor group 12c) on the left side in the y direction when viewed from the z direction.

For example, when viewed from the z direction, a cable connecting the other S-phase terminal of the 13th relay unit 13 and the other terminal of the 11th S-phase resistor group 11b and a cable connecting the other T-phase terminal of the 13th relay unit 13 and the other terminal of the 11th T-phase resistor group 11c are wired so as to be located outside a region where the resistor group is present in the 11th accommodation region 2a1, on the opposite side of a region where the 12th accommodation region 2a2 is present.

When viewed from the z direction, a cable connecting the other T-phase terminal of the 13th relay unit 13 and the other terminal of the 11th T-phase resistor group 11c is wired so as to be located outside a region where the resistor group is present in the 21st accommodation region 2b1, on the opposite side of a region where the 22nd accommodation region 2b2 is present.

When viewed from the z direction, a cable connecting the other S-phase terminal of the 15th relay unit 15 and the other terminal of the 12th S-phase resistor group 12b and a cable connecting the other T-phase terminal of the relay unit 15 and the other terminal of the 12th T-phase resistor group 12c are wired so as to be located outside a region where the resistor group is present in the 12th accommodation region 2a2, on the opposite side of a region where the 11th accommodation region 2a1 is present.

When viewed from the z direction, a cable connecting the other T-phase terminal of the 15th relay unit 15 and the other terminal of the 12th T-phase resistor group 12c is wired so as to be located outside a region where the resistor group is present in the 22nd accommodation region 2b2, on the opposite side of a region where the 21st accommodation region 2b1 is present.

When viewed from the z direction, a cable connecting one R-phase terminal of the 14th relay unit 14, one terminal of the 11th R-phase resistor group 11a, and one terminal of the 12th R-phase resistor group 12a is wired so as to be located between a region where the resistor group is present in the 21st accommodation region 2b1 and a region where the resistor group is present in the 22nd accommodation region 2b2.

When viewed from the z direction, a cable connecting one R-phase terminal of the 14th relay unit 14, one terminal of the 11th R-phase resistor group 11a, and one terminal of the 12th R-phase resistor group 12a, and a cable connecting one S-phase terminal of the 14th relay unit 14, one terminal of the 11th S-phase resistor group 11b, and one terminal of the 12th S-phase resistor group 12b are wired so as to be located between a region where the resistor group is present in the 31st accommodation region 2c1 and a region where the resistor group is present in the 32nd accommodation region 2c2.

This makes it possible to efficiently perform wiring with a short-circuit switch (such as the 14th relay unit 14) accommodated in the fifth accommodation region 2e using a space between the resistor groups adjacent in the y direction.

In the first embodiment, in each of the 11th R-phase resistor group 11a, the 11th S-phase resistor group 11b, the 11th T-phase resistor group 11c, the 12th R-phase resistor group 12a, the 12th S-phase resistor group 12b, and the 12th T-phase resistor group 12c, one stage of resistor row including seven resistors R arranged in the y direction and connected in series is arranged in the z direction. However, the number of the resistors R arranged in the resistor row and the number of stages in which the resistor rows are stacked are not limited thereto. The resistors R in said resistor row may be connected in parallel.

(Second Resistance Unit 20)

The second resistance unit 20 has the 21st R-phase resistor group 21a, the 21st S-phase resistor group 21b, the 21st T-phase resistor group 21c, the 22nd R-phase resistor group 22a, the 22nd S-phase resistor group 22b, the 22nd T-phase resistor group 22c, and the second switch group (the 23rd relay unit 23, the 24th relay unit 24, the relay unit 25).

The configuration of the 21st R-phase resistor group 21a of the second resistance unit 20 is similar to the configuration of the 11th R-phase resistor group 11a of the first resistance unit 10.

The configuration of the 21st S-phase resistor group 21b of the second resistance unit 20 is similar to the configuration of the 11th S-phase resistor group 11b of the first resistance unit 10.

The configuration of the 21st T-phase resistor group 21c of the second resistance unit 20 is similar to the configuration of the 11th T-phase resistor group 11c of the first resistance unit 10.

The configuration of the 23rd relay unit 23 of the second resistance unit 20 is similar to the configuration of the 13th relay unit 13 of the first resistance unit 10.

The configuration of the 24th relay unit 24 of the second resistance unit 20 is similar to the configuration of the 14th relay unit 14 of the first resistance unit 10.

The configuration of the 25th relay unit 25 of the second resistance unit 20 is similar to the configuration of the 15th relay unit 15 of the first resistance unit 10.

(10th Resistance Unit 100)

The 10th resistance unit 100 has the 110th R-phase resistor group 110a, the 110th S-phase resistor group 110b, the 110th T-phase resistor group 110c, the 120th R-phase resistor group 120a, the 120th S-phase resistor group 120b, the 120th T-phase resistor group 120c, and the 10th switch group (the 140th R-phase relay 140a, the 140th S-phase relay 140b, the 140th T-phase relay 140c, the 150th R-phase relay 150a, the 150th S-phase relay 150b, the 150th T-phase relay 150c).

The 110th R-phase resistor group 110a includes a resistor row in which a plurality of rod-shaped resistors R parallel to the x direction are arranged at predetermined intervals in the y direction.

The 120th R-phase resistor group 120a includes a resistor row in which a plurality of rod-shaped resistors R parallel to the x direction are arranged at predetermined intervals in the y direction.

The 120th R-phase resistor group 120a is provided on the left side in the y direction of the 110th R-phase resistor group 110a.

The 110th R-phase resistor group 110a and the 120th R-phase resistor group 120a are used to perform an R-phase load test of a test target power supply such as a three-phase AC generator connected via the first main relay unit the second main relay unit 6, the third main relay unit 7, the first fine-adjustment relay unit 8, the second fine-adjustment relay unit 9, and the 10th switch group.

The 110th R-phase resistor group 110a and the 120th R-phase resistor group 120a are connected in a state of being switchable between series and parallel depending on the operation states of the second main relay unit 6, the third main relay unit 7, the 140th R-phase relay 140a, the 140th S-phase relay 140b, and the 140th T-phase relay 140c.

The resistors R of the 110th R-phase resistor group 110a and the 120th R-phase resistor group 120a generate heat by receiving power supply from the test target power supply as a dummy load for the load test.

In the first embodiment, an example is shown in which each of the 110th R-phase resistor group 110a and the 120th R-phase resistor group 120a has a plurality of resistors R, but each of the groups may be configured by one resistor R.

For example, when the third main relay unit 7, the first fine-adjustment relay unit 8, and the second fine-adjustment relay unit 9 are turned on, and the second main relay unit 6, the 140th R-phase relay 140a, the 140th S-phase relay 140b, and the 140th T-phase relay 140c are turned off, the 110th R-phase resistor group 110a and the 120th R-phase resistor group 120a are connected in series.

When the third main relay unit 7 is turned off and the second main relay unit 6, the first fine-adjustment relay unit 8, the second fine-adjustment relay unit 9, the 140th R-phase relay 140a, the 140th S-phase relay 140b, and the 140th T-phase relay 140c are turned on, the 110th R-phase resistor group 110a and the 120th R-phase resistor group 120a are connected in parallel.

The 110th S-phase resistor group 110b includes a resistor row in which a plurality of rod-shaped resistors R parallel to the x direction are arranged at predetermined intervals in the y direction.

The 120th S-phase resistor group 120b includes a resistor row in which a plurality of rod-shaped resistors R parallel to the x direction are arranged at predetermined intervals in the y direction.

The 120th S-phase resistor group 120b is provided on the left side in the y direction of the 110th S-phase resistor group 110b.

The 110th S-phase resistor group 110b is located behind the 110th R-phase resistor group 110a in the x direction.

The 120th S-phase resistor group 120b is located behind the 120th R-phase resistor group 120a in the x direction.

The 110th S-phase resistor group 110b and the 120th S-phase resistor group 120b are used to perform an S-phase load test of a test target power supply such as a three-phase AC generator connected via the first main relay unit 5, the second main relay unit 6, the third main relay unit 7, the first fine-adjustment relay unit 8, the second fine-adjustment relay unit 9, and the 10th switch group.

The 110th S-phase resistor group 110b and the 120th S-phase resistor group 120b are connected in a state of being switchable between series and parallel depending on the operation states of the second main relay unit 6, the third main relay unit 7, the 140th R-phase relay 140a, the 140th S-phase relay 140b, and the 140th T-phase relay 140c.

The resistors R of the 110th S-phase resistor group 110b and the 120th S-phase resistor group 120b generate heat by receiving power supply from the test target power supply as a dummy load for the load test.

In the first embodiment, an example is shown in which each of the 110th S-phase resistor group 110b and the 120th S-phase resistor group 120b has a plurality of resistors R, but each of the groups may be configured by one resistor R.

For example, when the third main relay unit 7, the first fine-adjustment relay unit 8, and the second fine-adjustment relay unit 9 are turned on, and the second main relay unit 6, the 140th R-phase relay 140a, the 140th S-phase relay 140b, and the 140th T-phase relay 140c are turned off, the 110th S-phase resistor group 110b and the 120th S-phase resistor group 120b are connected in series.

When the third main relay unit 7 is turned off and the second main relay unit 6, the first fine-adjustment relay unit 8, the second fine-adjustment relay unit 9, the 140th R-phase relay 140a, the 140th S-phase relay 140b, and the 140th T-phase relay 140c are turned on, the 110th S-phase resistor group 110b and the 120th S-phase resistor group 120b are connected in parallel.

The 110th T-phase resistor group 110c includes a resistor row in which a plurality of rod-shaped resistors R parallel to the x direction are arranged at predetermined intervals in the y direction.

The 120th T-phase resistor group 120c includes a resistor row in which a plurality of rod-shaped resistors R parallel to the x direction are arranged at predetermined intervals in the y direction.

The 120th T-phase resistor group 120c is provided on the left side in the y direction of the 110th T-phase resistor group 110c.

The 110th T-phase resistor group 110c is located behind the 110th S-phase resistor group 110b in the x direction.

The 120th T-phase resistor group 120c is located behind the 120th S-phase resistor group 120b in the x direction.

The 110th T-phase resistor group 110c and the 120th T-phase resistor group 120c are used to perform a T-phase load test of a test target power supply such as a three-phase AC generator connected via the first main relay unit 5, the second main relay unit 6, the third main relay unit 7, the first fine-adjustment relay unit 8, the second fine-adjustment relay unit 9, and the 10th switch group.

The 110th T-phase resistor group 110c and the 120th T-phase resistor group 120c are connected in a state of being switchable between series and parallel depending on the operation states of the second main relay unit 6, the third main relay unit 7, the 140th R-phase relay 140a, the 140th S-phase relay 140b, and the 140th T-phase relay 140c.

The resistors R of the 110th T-phase resistor group 110c and the 120th T-phase resistor group 120c generate heat by receiving power supply from the test target power supply as a dummy load for the load test.

In the first embodiment, an example is shown in which each of the 110th T-phase resistor group 110c and the 120th T-phase resistor group 120c has a plurality of resistors R, but each of the groups may be configured by one resistor R.

For example, when the third main relay unit 7, the first fine-adjustment relay unit 8, and the second fine-adjustment relay unit 9 are turned on, and the second main relay unit 6, the 140th R-phase relay 140a, the 140th S-phase relay 140b, and the 140th T-phase relay 140c are turned off, the 110th T-phase resistor group 110c and the 120th T-phase resistor group 120c are connected in series.

When the third main relay unit 7 is turned off and the second main relay unit 6, the first fine-adjustment relay unit 8, the second fine-adjustment relay unit 9, the 140th R-phase relay 140a, the 140th S-phase relay 140b, and the 140th T-phase relay 140c are turned on, the 110th T-phase resistor group 110c and the 120th T-phase resistor group 120c are connected in parallel.

In the first embodiment, the resistors R of the 110th R-phase resistor group 110a, the 120th R-phase resistor group 120a, the 110th S-phase resistor group 110b, the 120th S-phase resistor group 120b, the 110th T-phase resistor group 110c, and the 120th T-phase resistor group 120c extend in the x direction (first direction). The resistors R of the 110th R-phase resistor group 110a and the 120th R-phase resistor group 120a are arranged in the y direction (second direction). The resistors R of the 110th S-phase resistor group 110b and the 120th S-phase resistor group 120b are arranged in the y direction (second direction). The resistors R of the 110th T-phase resistor group 110c and the 120th T-phase resistor group 120c are arranged in the y direction (second direction).

However, the resistors R of the 110th R-phase resistor group 110a, the 120th R-phase resistor group 120a, the 110th S-phase resistor group 110b, the 120th S-phase resistor group 120b, the 110th T-phase resistor group 110c, and the 120th T-phase resistor group 120c may extend in the y direction (second direction). In this case, the resistors R in the 110th R-phase resistor group 110a and the 120th R-phase resistor group 120a are arranged in the x direction (first direction). The resistors R of the 110th S-phase resistor group 110b and the 120th S-phase resistor group 120b are arranged in the x direction (first direction). The resistors R of the 110th T-phase resistor group 110c and the 120th T-phase resistor group 120c are arranged in the x direction (first direction).

The 150th R-phase relay 150a is used to control on/off of power supply from the first main relay unit 5 to the 110th R-phase resistor group 110a and the 120th R-phase resistor group 120a.

One terminal of the 150th R-phase relay 150a is connected to the other R-phase terminal of the second fine-adjustment relay unit 9, or the like.

The other terminal of the 150th R-phase relay 150a is connected to the other terminal of the 120th R-phase resistor group 120a.

The 150th S-phase relay 150b is used to control on/off of power supply from the first main relay unit 5 to the 110th S-phase resistor group 110b and the 120th S-phase resistor group 120b.

One terminal of the 150th S-phase relay 150b is connected to the other S-phase terminal of the second fine-adjustment relay unit 9, or the like.

The other terminal of the 150th S-phase relay 150b is connected to the other terminal of the 120th S-phase resistor group 120b.

The 150th T-phase relay 150c is used to control on/off of power supply from the first main relay unit 5 to the 110th T-phase resistor group 110c and the 120th T-phase resistor group 120c.

One terminal of the 150th T-phase relay 150c is connected to the other T-phase terminal of the second fine-adjustment relay unit 9, or the like.

The other terminal of the 150th T-phase relay 150c is connected to the other terminal of the 120th T-phase resistor group 120c.

The 140th R-phase relay 140a, the 140th S-phase relay 140b, and the 140th T-phase relay 140c are used for neutral point connection when the 110th R-phase resistor group 110a and the 120th R-phase resistor group 120a are connected in parallel, the 110th S-phase resistor group 110b and the 120th S-phase resistor group 120b are connected in parallel, and the 110th T-phase resistor group 110c and the 120th T-phase resistor group 120c are connected in parallel.

That is, the 140th R-phase relay 140a, the 140th S-phase relay 140b, and the 140th T-phase relay 140c are used to control on/off of short-circuiting of one terminal of the 110th R-phase resistor group 110a, one terminal of the 110th S-phase resistor group 110b, and one terminal of the 110th T-phase resistor group 110c.

One terminal of the 140th R-phase relay 140a is connected to one terminal of the 110th R-phase resistor group 110a and one terminal of the 120th R-phase resistor group 120a.

One terminal of the 140th S-phase relay 140b is connected to one terminal of the 110th S-phase resistor group 110b and one terminal of the 120th S-phase resistor group 120b.

One terminal of the 140th T-phase relay 140c is connected to one terminal of the 110th T-phase resistor group 110c and one terminal of the 120th T-phase resistor group 120c.

The other terminal of the 140th R-phase relay 140a, the other terminal of the 140th S-phase relay 140b, and the other terminal of the 140th T-phase relay 140c are short-circuited.

A cable connecting the relay (such as the first fine-adjustment relay unit 8) accommodated in the fourth accommodation region 2d and the resistor group (such as the 110th T-phase resistor group 110c) accommodated in the 11th accommodation region 2a1, the 21st accommodation region 2b1, and the 31st accommodation region 2c1 is desirably provided outside said resistor group, on the opposite side of a region including the 12th accommodation region 2a2, the 22nd accommodation region 2b2, and the 32nd accommodation region 2c2 when viewed from the z direction.

A cable connecting the relay (such as the second fine-adjustment relay unit 9) accommodated in the fourth accommodation region 2d and the resistor group (such as the 120th T-phase resistor group 120c) accommodated in the 12th accommodation region 2a2, the 22nd accommodation region 2b2, and the 32nd accommodation region 2c2 is desirably provided outside said resistor group on the opposite side of the 11th accommodation region 2a1, the 21st accommodation region 2b1, and the 31st accommodation region 2c1 when viewed from the z direction.

A cable connecting the relay (such as the 140th R-phase relay 140a) accommodated in the fifth accommodation region 2e and the resistor group (such as the 110th R-phase resistor group 110a) accommodated in the 11th accommodation region 2a1, the 21st accommodation region 2b1, the 31st accommodation region 2c1, the 12th accommodation region 2a2, the 22nd accommodation region 2b2, and the 32nd accommodation region 2c2 is desirably provided between the resistor group (such as the 110th T-phase resistor group 110c) on the right side in the y direction and the resistor group (such as the 120th T-phase resistor group 120c) on the left side in the y direction when viewed from the z direction.

For example, when viewed from the z direction, a cable connecting the other S-phase terminal of the first fine-adjustment relay unit 8 and the other terminal of the 110th S-phase resistor group 110b and a cable connecting the other T-phase terminal of the first fine-adjustment relay unit 8 and the other terminal of the 110th T-phase resistor group 110c are wired so as to be located outside a region where the resistor group is present in the 11th accommodation region 2a1, on the opposite side of a region where the 12th accommodation region 2a2 is present.

When viewed from the z direction, a cable connecting the other T-phase terminal of the first fine-adjustment relay unit 8 and the other terminal of the 110th T-phase resistor group 110*c* is wired so as to be located outside a region where the resistor group is present in the 21st accommodation region 2*b*1, on the opposite side of a region where the 22nd accommodation region 2*b*2 is present.

When viewed from the z direction, a cable connecting the other terminal of the 150th S-phase relay 150*b* and the other terminal of the 120th S-phase resistor group 120*b* and a cable connecting the other terminal of the 150th T-phase relay 150*c* and the other terminal of the 120th T-phase resistor group 120*c* are wired so as to be located outside a region where the resistor group is present in the 12th accommodation region 2*a*2, on the opposite side of a region where the 11th accommodation region 2*a*1 is present.

When viewed from the z direction, a cable connecting the other terminal of the 150th T-phase relay 150*c* and the other terminal of the 120th T-phase resistor group 120*c* is wired so as to be located outside a region where the resistor group is present in the 22nd accommodation region 2*b*2, on the opposite side of a region where the 21st accommodation region 2*b*1 is present.

When viewed from the z direction, a cable connecting one terminal of the 140th R-phase relay 140*a*, one terminal of the 110th R-phase resistor group 110*a*, and one terminal of the 120th R-phase resistor group 120*a* is wired so as to be located between a region where the resistor group is present in the 21st accommodation region 2*b*1 and a region where the resistor group is present in the 22nd accommodation region 2*b*2.

When viewed from the z direction, a cable connecting one terminal of the 140th R-phase relay 140*a*, one terminal of the 110th R-phase resistor group 110*a*, and one terminal of the 120th R-phase resistor group 120*a*, and a cable connecting one terminal of the 140th S-phase relay 140*b*, one terminal of the 110th S-phase resistor group 110*b*, and one terminal of the 120th S-phase resistor group 120*b* are wired so as to be located between a region where the resistor group is present in the 31st accommodation region 2*c*1 and a region where the resistor group is present in the 32nd accommodation region 2*c*2.

This makes it possible to efficiently perform wiring with a short-circuit switch (such as the 140th R-phase relay 140*a*) accommodated in the fifth accommodation region 2*e* using a space between the resistor groups adjacent in the y direction.

In the first embodiment, in each of the 110th R-phase resistor group 110*a*, the 110th S-phase resistor group 110*b*, the 110th T-phase resistor group 110*c*, the 120th R-phase resistor group 120*a*, the 120th S-phase resistor group 120*b*, and the 120th T-phase resistor group 120*c*, one stage of resistor row including seven resistors R arranged in the y direction and connected in series is arranged in the z direction. However, the number of the resistors R arranged in the resistor row and the number of stages in which the resistor rows are stacked are not limited thereto. The resistors R in said resistor row may be connected in parallel.

(20th Resistance Unit 200)

The 20th resistance unit 200 has the 210th R-phase resistor group 210*a*, the 210th S-phase resistor group 210*b*, the 210th T-phase resistor group 210*c*, the 220th R-phase resistor group 220*a*, the 220th S-phase resistor group 220*b*, the 220th T-phase resistor group 220*c*, and the 20th switch group (the 240th R-phase relay 240*a*, the 240th S-phase relay 240*b*, the 240th T-phase relay 240*c*, the 250th R-phase relay 250*a*, the 250th S-phase relay 250*b*, the 250th T-phase relay 250*c*).

The configuration of the 210th R-phase resistor group 210*a* of the 20th resistance unit 200 is similar to the configuration of the 110th R-phase resistor group 110*a* of the 10th resistance unit 100.

The configuration of the 210th S-phase resistor group 210*b* of the 20th resistance unit 200 is similar to the configuration of the 110th S-phase resistor group 110*b* of the 10th resistance unit 100.

The configuration of the 210th T-phase resistor group 210*c* of the 20th resistance unit 200 is similar to the configuration of the 110th T-phase resistor group 100*c* of the 10th resistance unit 100.

The configuration of the 240th R-phase relay 240*a* of the 20th resistance unit 200 is similar to the configuration of the 140th R-phase relay 140*a* of the 10th resistance unit 100.

The configuration of the 240th S-phase relay 240*b* of the 20th resistance unit 200 is similar to the configuration of the 140th S-phase relay 140*b* of the 10th resistance unit 100.

The configuration of the 240th T-phase relay 240*c* of the 20th resistance unit 200 is similar to the configuration of the 140th T-phase relay 140*c* of the 10th resistance unit 100.

The configuration of the 250th R-phase relay 250*a* of the 20th resistance unit 200 is similar to the configuration of the 150th R-phase relay 150*a* of the 10th resistance unit 100.

The configuration of the 250th S-phase relay 250*b* of the 20th resistance unit 200 is similar to the configuration of the 150th S-phase relay 150*b* of the 10th resistance unit 100.

The configuration of the 250th T-phase relay 250*c* of the 20th resistance unit 200 is similar to the configuration of the 150th T-phase relay 150*c* of the 10th resistance unit 100.

(Cooling Unit 80)

The cooling unit 80 has the first R-phase cooling unit 81*a*, the second R-phase cooling unit 82*a*, the first S-phase cooling unit 81*b*, the second S-phase cooling unit 82*b*, the first T-phase cooling unit 81*c*, and the second T-phase cooling unit 82*c*.

The first R-phase cooling unit 81*a* cools the 11th R-phase resistor group 11*a*, the 21st R-phase resistor group 21*a*, the 110th R-phase resistor group 110*a*, and the 210th R-phase resistor group 210*a*.

The second R-phase cooling unit 82*a* cools the 12th R-phase resistor group 12*a*, the 22nd R-phase resistor group 22*a*, the 120th R-phase resistor group 120*a*, and the 220th R-phase resistor group 220*a*.

The first S-phase cooling unit 81*b* cools the 11th S-phase resistor group 11*b*, the 21st S-phase resistor group 21*b*, the 110th S-phase resistor group 110*b*, and the 210th S-phase resistor group 210*b*.

The second S-phase cooling unit 82*b* cools the 12th S-phase resistor group 12*b*, the 22nd S-phase resistor group 22*b*, the 120th S-phase resistor group 120*b*, and the 220th S-phase resistor group 220*b*.

The first T-phase cooling unit 81*c* cools the 11th T-phase resistor group 11*c*, the 21st T-phase resistor group 21*c*, the 110th T-phase resistor group 110*c*, and the 210th T-phase resistor group 210*c*.

The second T-phase cooling unit 82*c* cools the 12th T-phase resistor group 12*c*, the 22nd T-phase resistor group 22*c*, the 120th T-phase resistor group 120*c*, and the 220th T-phase resistor group 220*c*.

(Operation Unit 91)

The operation unit 91 is used for operating the on/off of the load testing device 1, selecting the type of the test target power supply (mode switching), and selecting the load amount.

The on/off state of the switch such as the 13th relay unit 13 is controlled according to the operation state of the operation unit 91.

(On/Off Operation of load testing device 1)

When the operation of turning on the load testing device 1 is performed, the first main relay unit 5 is turned on, and power can be supplied from the test target power supply connected via the terminal unit 93. The cooling unit 80 is driven.

(Mode Switching)

When the operation related to mode switching is performed, the on/off control of the switch (13th relay unit 13) or the like is performed in accordance with the operation state of the mode switching.

For example, when a mode corresponding to a high-voltage test target power supply is selected, on/off control of the switch is performed such that two resistor groups adjacent in the y direction, such as the 11th R-phase resistor group 11a and the 12th R-phase resistor group 12a, are connected in series.

Figure 7:
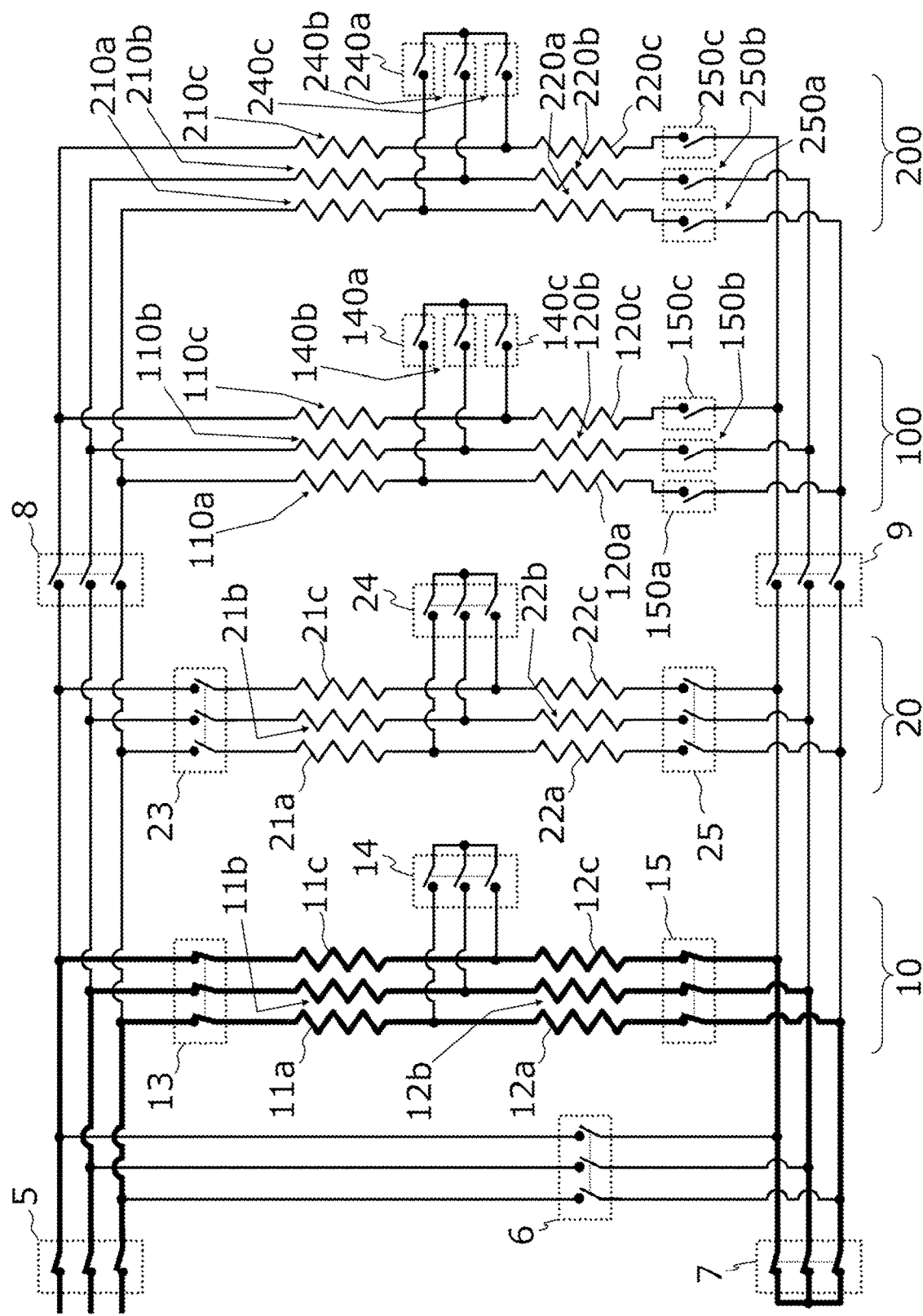
FIG. 7 is a circuit diagram of a first resistance unit, a second resistance unit, a 10th resistance unit, and a resistance unit in a state where resistor groups adjacent in a y direction are connected in series and power is supplied to the first resistance unit.

Specifically, the second main relay unit 6, the 14th relay unit 14, the 24th relay unit 24, the 140th R-phase relay 140a, the 140th S-phase relay 140b, the 140th T-phase relay 140c, the 240th R-phase relay 240a, the 240th S-phase relay 240b, and the 240th T-phase relay 240c are turned off, and the third main relay unit 7 is turned on (see FIG. 7).

When a mode corresponding to a low-voltage test target power supply is selected, the on/off control of the switch is performed such that two resistor groups adjacent in the y direction, such as the 11th R-phase resistor group 11a and the 12th R-phase resistor group 12a, are connected in parallel.

Figure 8:
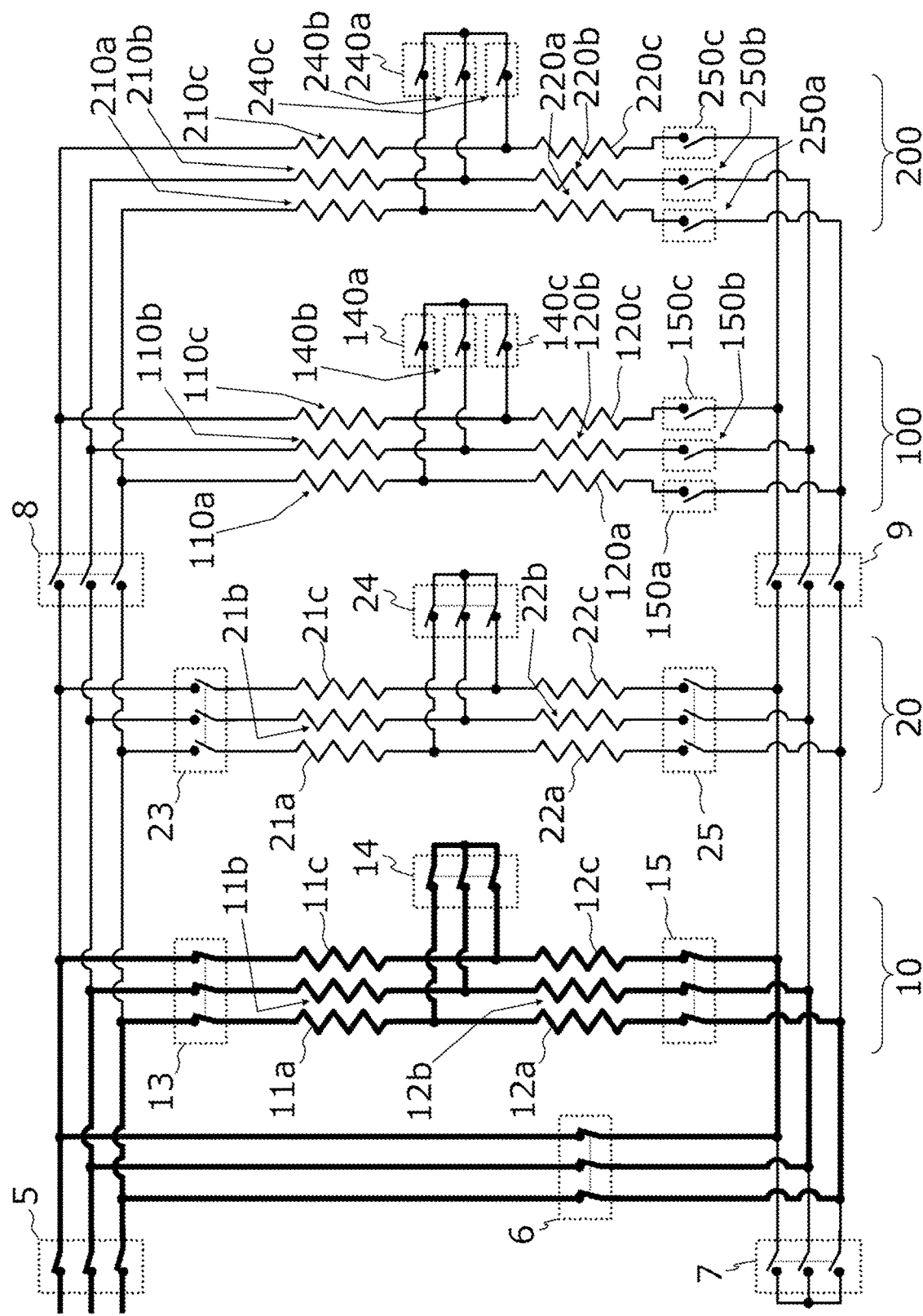
FIG. 8 is a circuit diagram of a first resistance unit, a second resistance unit, a 10th resistance unit, and a resistance unit in a state where resistor groups adjacent in a y direction are connected in parallel and power is supplied to the first resistance unit.

Specifically, the second main relay unit 6, the 14th relay unit 14, the 24th relay unit 24, the 140th R-phase relay 140a, the 140th S-phase relay 140b, the 140th T-phase relay 140c, the 240th R-phase relay 240a, the 240th S-phase relay 240b, and the 240th T-phase relay 240c are turned on, and the third main relay unit 7 is turned off (see FIG. 8).

However, among the 14th relay unit 14, the 24th relay unit 24, the 140th R-phase relay 140a, the 140th S-phase relay 140b, the 140th T-phase relay 140c, the 240th R-phase relay 240a, the 240th S-phase relay 240b, and the 240th T-phase relay 240c, those included in the resistance unit to which power is not supplied may be turned off.

In order to prevent power from being supplied to the resistor group or the like by mistake at the time of switching these relays, the 14th relay unit 14 or the like is switched on and off in a state where the first fine-adjustment relay unit 8, the second fine-adjustment relay unit 9, the 13th relay unit 13, the 15th relay unit 15, the 23rd relay unit 23, and the 25th relay unit 25 are turned off.

That is, in a state where power supply from the test target power supply to the first resistance unit 10 via the terminal unit 93 is not performed, a connection state between the 11th R-phase resistor group 11a and the 12th R-phase resistor group 12a, a connection state between the 11th S-phase resistor group 11b and the 12th S-phase resistor group 12b, and a connection state between the 11th T-phase resistor group 11c and the 12th T-phase resistor group 12c are switched.

In a state where power supply from the test target power supply to the second resistance unit 20 via the terminal unit 93 is not performed, a connection state between the 21st R-phase resistor group 21a and the 22nd R-phase resistor group 22a, a connection state between the 21st S-phase resistor group 21b and the 22nd S-phase resistor group 22b, and a connection state between the 21st T-phase resistor group 21c and the 22nd T-phase resistor group 22c are switched.

In a state where power supply from the test target power supply to the 10th resistance unit 100 via the terminal unit 93 is not performed, a connection state between the 110th R-phase resistor group 110a and the 120th R-phase resistor group 120a, a connection state between the 110th S-phase resistor group 110b and the 120th S-phase resistor group 120b, and a connection state between the 110th T-phase resistor group 110c and the 120th T-phase resistor group 120c are switched.

In a state where power supply from the test target power supply to the 20th resistance unit 200 via the terminal unit 93 is not performed, a connection state between the 210th R-phase resistor group 210a and the 220th R-phase resistor group 220a, a connection state between the 210th S-phase resistor group 210b and the 220th S-phase resistor group 220b, and a connection state between the 210th T-phase resistor group 210c and the 220th T-phase resistor group 220c are switched.

(Selection of Load Amount)

When the operation related to the selection of a load amount is performed, the on/off control of the relay (such as the 13th relay unit 13) is performed according to the selected load amount.

For example, when a first load amount in two stages is selected without the fine-adjustment of the load amount, the 13th relay unit 13 and the 15th relay unit 15 are turned on, and the 23rd relay unit 23 and the 25th relay unit 25 are turned off (see FIGS. 7 and 8). The first fine-adjustment relay unit 8 and the second fine-adjustment relay unit 9 are turned off.

In this case, power is supplied from the test target power supply to the first resistance unit 10, and power is not supplied from the test target power supply to the second resistance unit 20, the 10th resistance unit 100, and the 20th resistance unit 200.

Figure 9:
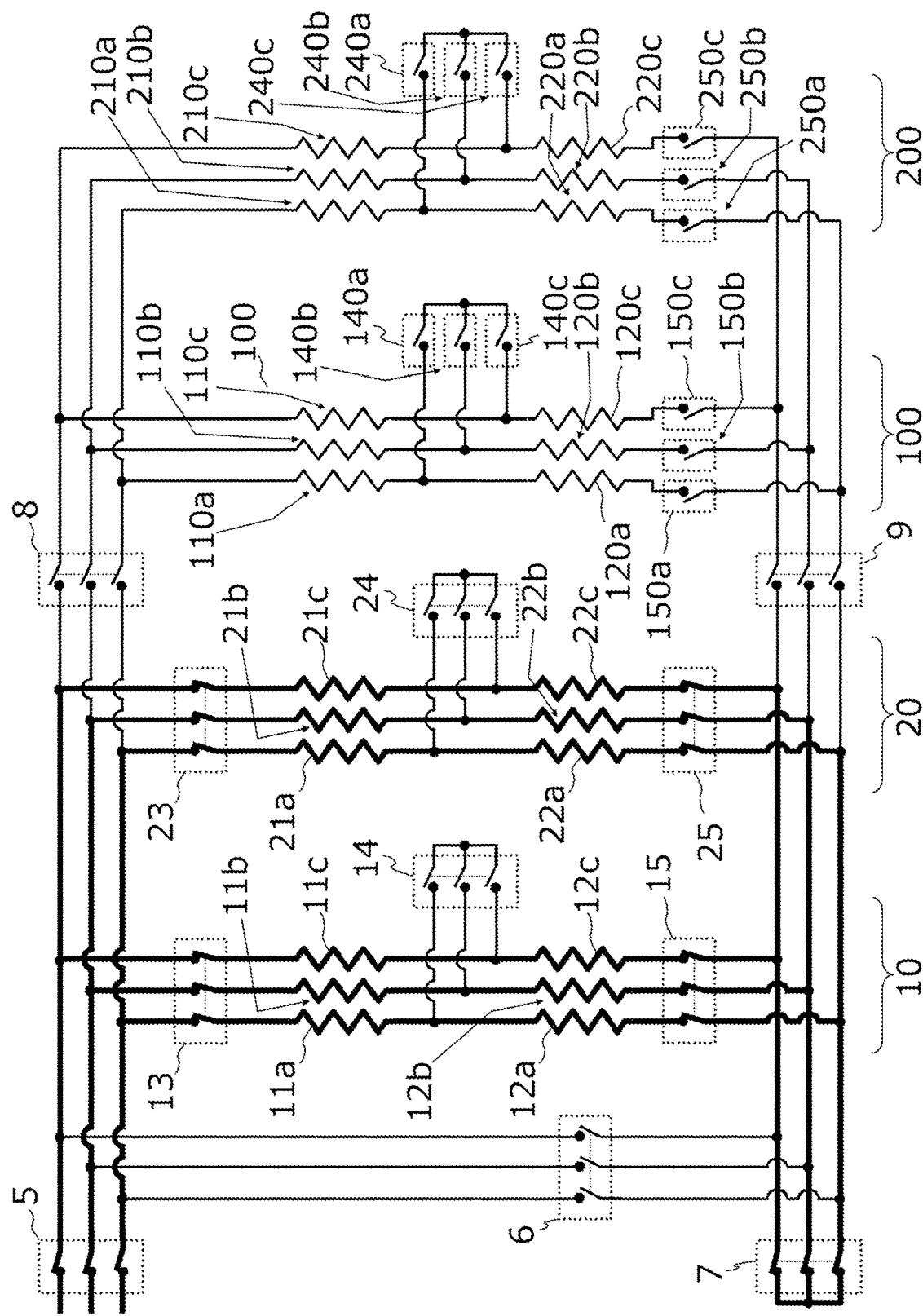
FIG. 9 is a circuit diagram of a first resistance unit, a second resistance unit, a 10th resistance unit, and a resistance unit in a state where resistor groups adjacent in a y direction are connected in series and power is supplied to the first resistance unit and the second resistance unit.
Figure 10:
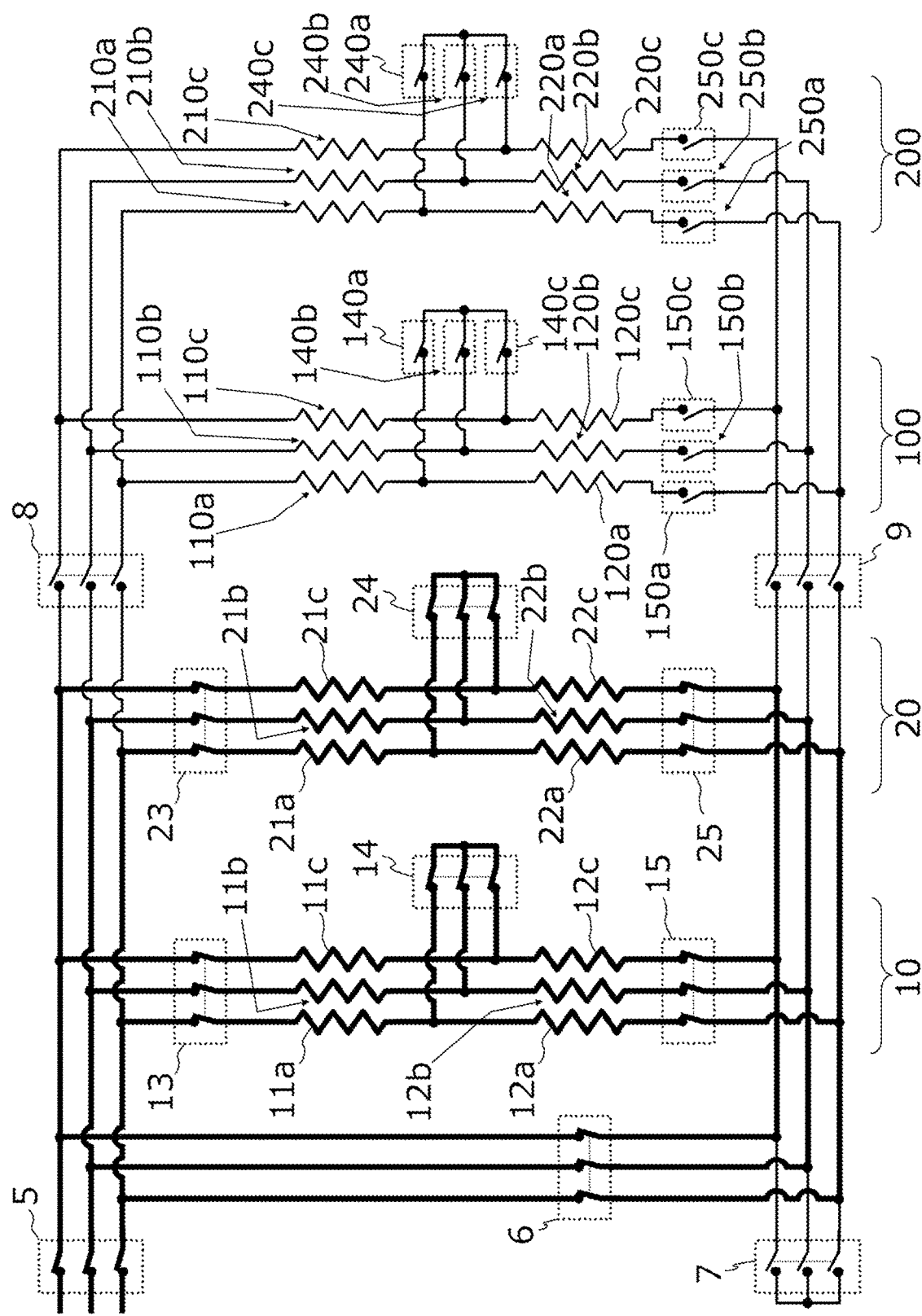
FIG. 10 is a circuit diagram of a first resistance unit, a second resistance unit, a 10th resistance unit, and a 20th resistance unit in a state where resistor groups adjacent in a y direction are connected in parallel and power is supplied to the first resistance unit and the second resistance unit.

When a second load amount in two stages is selected without the fine-adjustment of the load amount, the 13th relay unit 13, the 15th relay unit 15, the 23rd relay unit 23, and the 25th relay unit 25 are turned on (see FIGS. 9 and 10). The first fine-adjustment relay unit 8 and the second fine-adjustment relay unit 9 are turned off.

In this case, power is supplied from the test target power supply to the first resistance unit 10 and the second resistance unit 20, and power is not supplied from the test target power supply to the 10th resistance unit 100 and the resistance unit 200.

Figure 11:
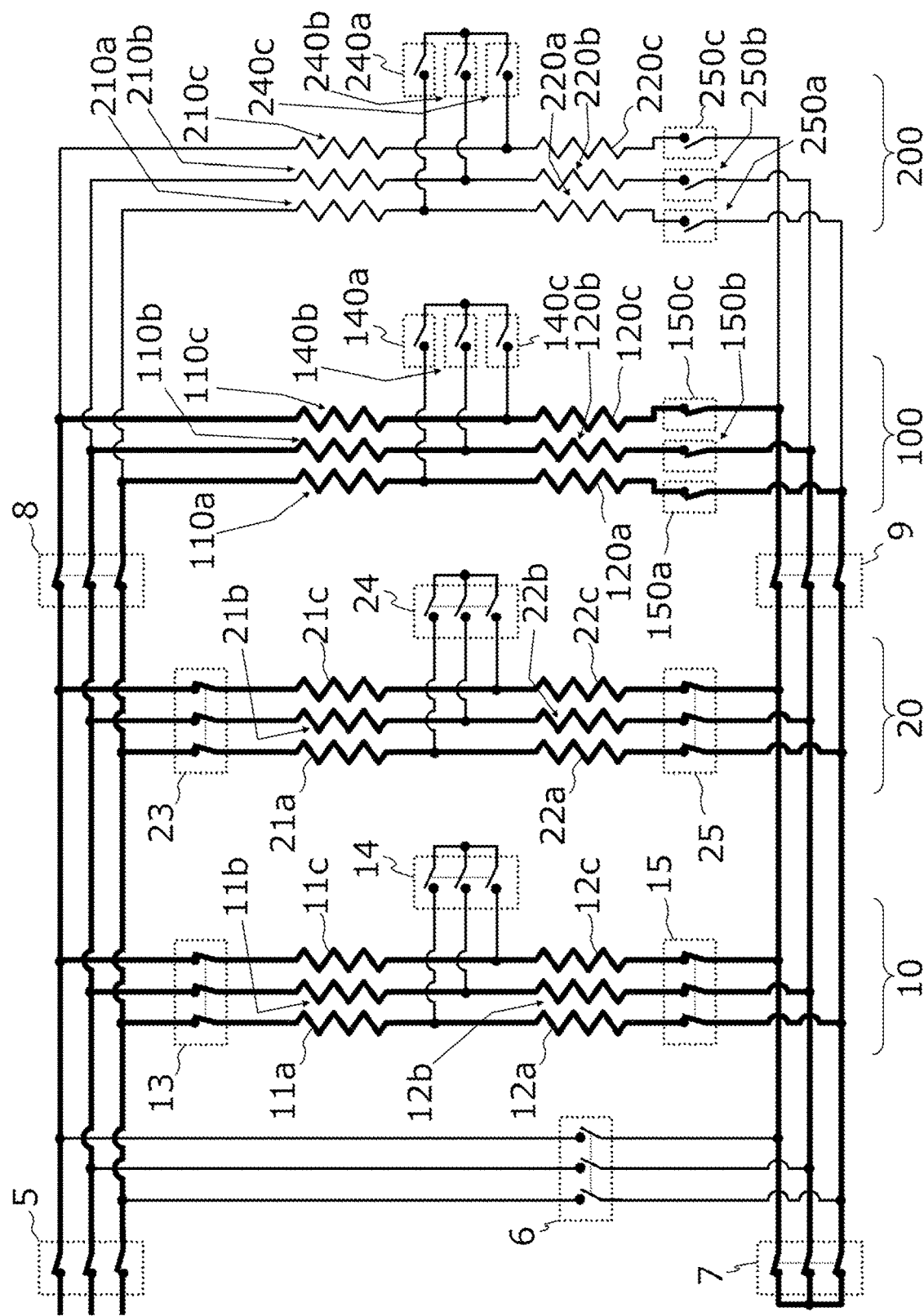
FIG. 11 is a circuit diagram of a first resistance unit, a second resistance unit, a 10th resistance unit, and a 20th resistance unit in a state where resistor groups adjacent in a y direction are connected in series and power is supplied to the first resistance unit, the second resistance unit, and the 10th resistance unit.
Figure 12:
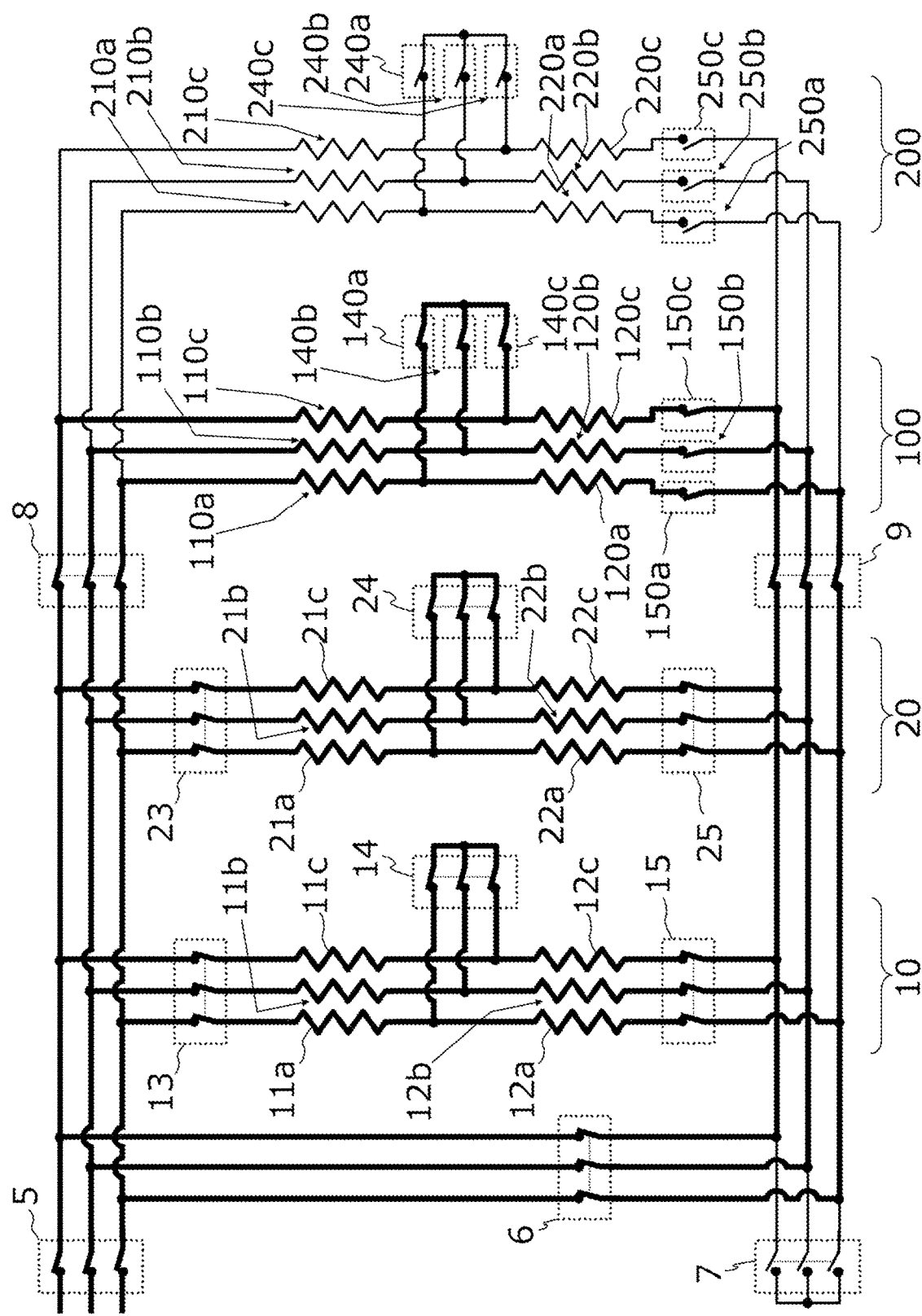
FIG. 12 is a circuit diagram of a first resistance unit, a second resistance unit, a 10th resistance unit, and a 20th resistance unit in a state where resistor groups adjacent in a y direction are connected in parallel and power is supplied to the first resistance unit, the second resistance unit, and the 10th resistance unit.

When the second load amount in two stages is selected with the fine-adjustment of the load amount, the 13th relay unit 13, the 15th relay unit 15, the 23rd relay unit 23, and the 25th relay unit 25 are turned on (see FIGS. 11 and 12).

The first fine-adjustment relay unit 8, the second fine-adjustment relay unit 9, the 150th R-phase relay 150a, the 150th S-phase relay 150b, and the 150th T-phase relay 150c are turned on, and the 250th R-phase relay 250a, the 250th S-phase relay 250b, and the 250th T-phase relay 250c are turned off.

In this case, power is supplied from the test target power supply to the first resistance unit 10, the second resistance unit 20, and the 10th resistance unit 100, and power is not supplied from the test target power supply to the 20th resistance unit 200.

However, the 250th R-phase relay 250a, the 250th S-phase relay 250b, and the 250th T-phase relay 250c may be turned on according to the degree of fine-adjustment. In this case, power is supplied from the test target power supply to the first resistance unit 10, the second resistance unit 20, the 10th resistance unit 100, and the 20th resistance unit 200.

Figure 13:
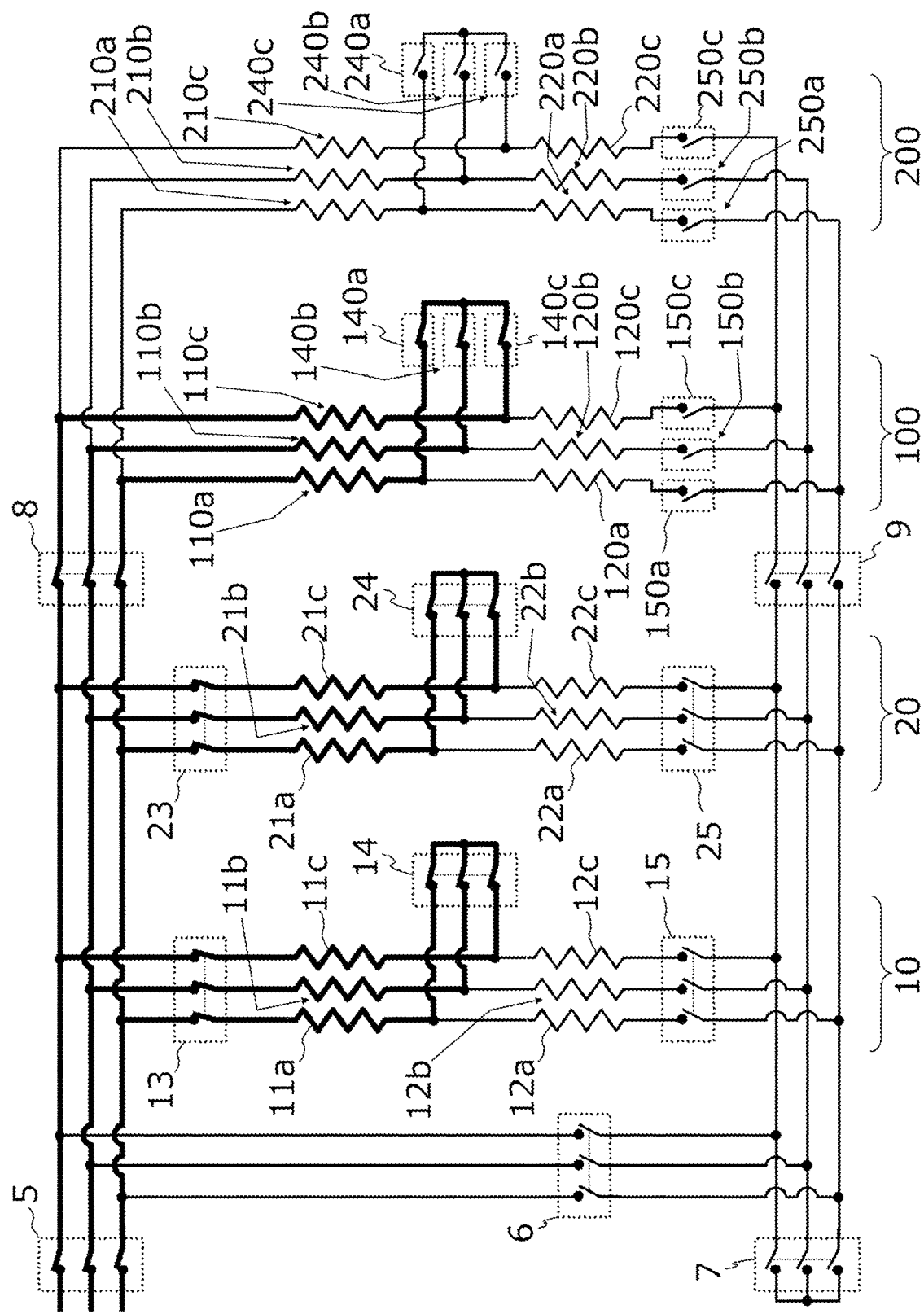
FIG. 13 is a circuit diagram of a first resistance unit, a second resistance unit, a 10th resistance unit, and a 20th resistance unit in a state where power is supplied only to half of resistor groups of the first resistance unit, the second resistance unit, and the 10th resistance unit.
Figure 14:
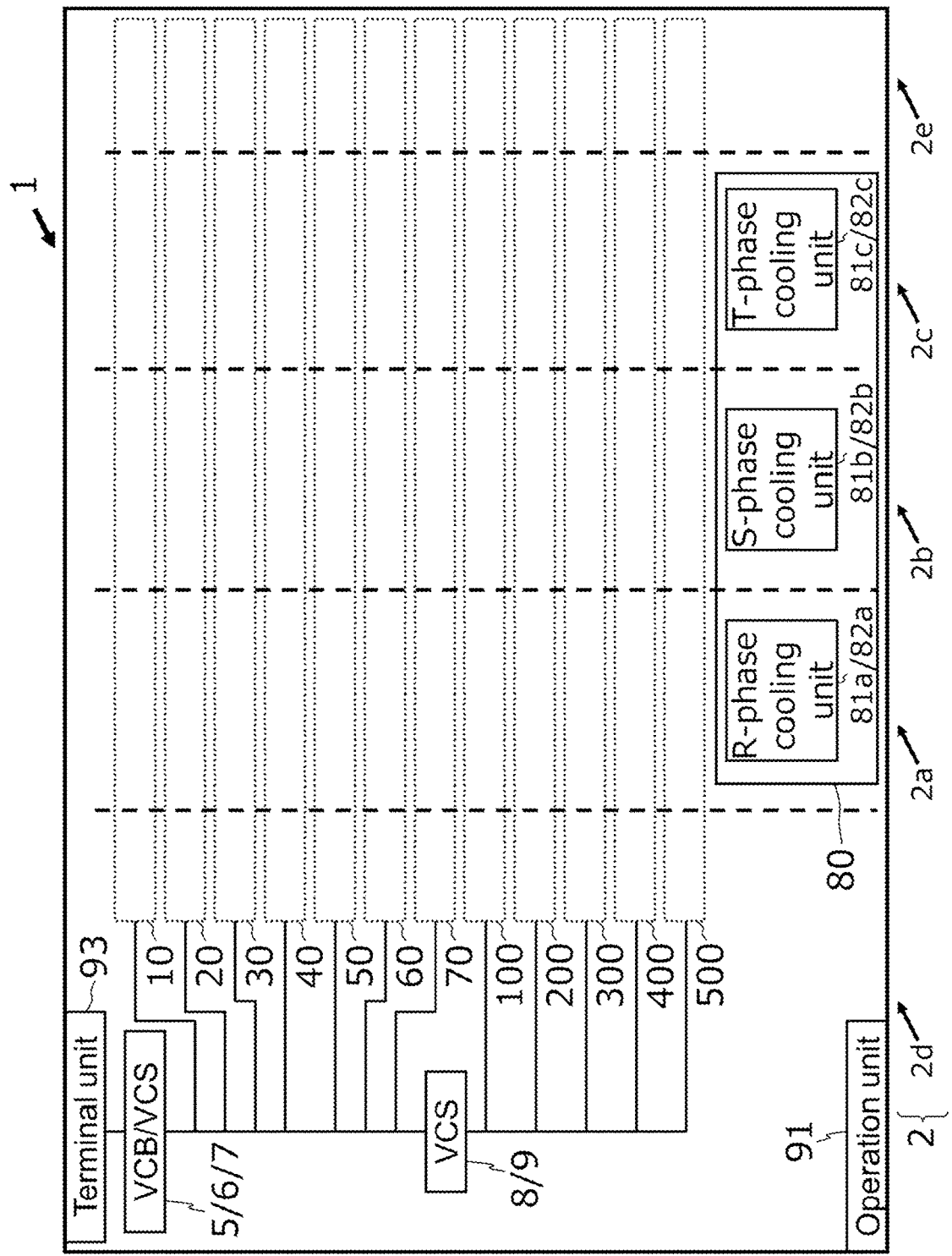
FIG. 14 is a schematic view illustrating the configuration of a load testing device in a second embodiment.

When a small load amount is set, only power may be supplied to some resistor groups of the resistance unit (see FIG. 13).

FIG. 13 illustrates an example in which power is supplied to resistor groups included in the 11th accommodation region 2a1, the 21st accommodation region 2b1, and the 31st accommodation region 2c1, and power is not supplied to resistor groups included in the 12th accommodation region 2a2, the 22nd accommodation region 2b2, and the 32nd accommodation region 2c2.

Specifically, the second main relay unit 6, the third main relay unit 7, the second fine-adjustment relay unit 9, the 15th relay unit 15, the 25th relay unit 25, the 150th R-phase relay 150a, the 150th S-phase relay 150b, the 150th T-phase relay 150c, the 250th R-phase relay 250a, the 250th S-phase relay 250b, and the 250th T-phase relay 250c are turned off.

The on/off states of the first fine-adjustment relay unit 8, the 13th relay unit 13, the 14th relay unit 14, the 23rd relay unit 23, the 24th relay unit 24, the 140th R-phase relay 140a, the 140th S-phase relay 140b, the 140th T-phase relay 140c, the 240th R-phase relay 240a, the 240th S-phase relay 240b, and the 240th T-phase relay 240c are controlled according to the set load amount.

FIG. 13 illustrates a state where the first fine-adjustment relay unit 8, the 13th relay unit 13, the 14th relay unit 14, the 23rd relay unit 23, the 24th relay unit 24, the 140th R-phase relay 140a, the 140th S-phase relay 140b, and the 140th T-phase relay 140c are turned on, and the 240th R-phase relay 240a, the 240th S-phase relay 240b, and the 240th T-phase relay 240c are turned off.

The terminal unit 93 is a terminal for connecting a test target power supply.

The test target power supply and the first main relay unit 5 are electrically connected via the terminal unit 93.

(Switch, Power Supply for Driving Cooling Unit And The Like)

Electric devices constituting the load testing device 1, such as the 13th relay unit 13 and the first R-phase cooling unit 81a, other than the resistor group, such as the 11th R-phase resistor group 11a, may be driven on the basis of power supply from a power supply (for example, a commercial power supply and the like) different from the test target power supply, or may be driven on the basis of power supply from the test target power supply.

(Application Example of Short-Circuit Switch)

In the first embodiment, the example has been described in which the short-circuit switches (the 14th relay unit 14, the 24th relay unit 24, the 140th R-phase relay 140a, the 140th S-phase relay 140b, the 140th T-phase relay 140c, the 240th R-phase relay 240a, the 240th S-phase relay 240b, the 240th T-phase relay 240c) for neutral point connection when the resistor groups adjacent in the y direction are connected in parallel are separately provided for stages.

However, one short-circuit switch (for example, the 14th relay unit 14) may be shared for neutral point connection when resistor groups adjacent in the y direction in another stage are connected in parallel.

The example has been described in which the short-circuit switch (third main relay unit 7) for neutral point connection when the resistor groups adjacent in the y direction are connected in series is shared for neutral point connection when the resistor groups adjacent in the y direction in another stage are connected in series.

However, the short-circuit switches for neutral point connection when the resistor groups adjacent in the y direction are connected in series may be provided separately for stages.

Application Example of Number of Stages of Load Amount

In the first embodiment, the example has been described in which the two-stage adjustment of the load amount and the two-stage fine-adjustment of the load amount can be performed using the four resistance units (the first resistance unit 10, the second resistance unit 20, the 10th resistance unit 100, the 20th resistance unit 200).

However, the number of stages for adjusting the load amount is not limited to 4.

For example, it is conceivable that the load amount can be adjusted in seven stages and the load amount can be finely adjusted in five stages (see the second embodiment, FIGS. 14 to 18).

A dry load testing device 1 according to the second embodiment includes a housing 2, a first main relay unit 5, a second main relay unit 6, a third main relay unit 7, a first fine-adjustment relay unit 8, a second fine-adjustment relay unit 9, a first resistance unit 10 to a seventh resistance unit 70, a 10th resistance unit 100 to a resistance unit 500, a cooling unit 80, an operation unit 91, and a terminal unit 93.

The configurations of the housing 2, the first main relay unit 5, the second main relay unit 6, the third main relay unit 7, the first fine-adjustment relay unit 8, the second fine-adjustment relay unit 9, the first resistance unit 10, the second resistance unit 20, the 10th resistance unit 100, the 20th resistance unit 200, the cooling unit the operation unit 91, and the terminal unit 93 of the second embodiment are similar to those of the first embodiment.

(Third Resistance Unit 30)

The third resistance unit 30 has a 31st R-phase resistor group 31a, a 31st S-phase resistor group 31b, a 31st T-phase resistor group 31c, a 32nd R-phase resistor group 32a, a 32nd S-phase resistor group 32b, a 32nd T-phase resistor group 32c, and a third switch group (a 33rd relay unit 33, a 34th relay unit 34, a 35th relay unit 35).

The configuration of the third resistance unit 30 is similar to the configuration of the first resistance unit (Fourth Resistance Unit 40)

The fourth resistance unit 40 has a 41st R-phase resistor group 41a, a 41st S-phase resistor group 41b, a 41st T-phase resistor group 41c, a 42nd R-phase resistor group 42a, a 42nd S-phase resistor group 42b, a 42nd T-phase resistor group 42c, and a fourth switch group (a 43rd relay unit 43, a 44th relay unit 44, a 45th relay unit 45).

The configuration of the fourth resistance unit 40 is similar to the configuration of the first resistance unit (Fifth Resistance Unit 50)

The fifth resistance unit 50 has a 51st R-phase resistor group 51a, a 51st S-phase resistor group 51b, a 51st T-phase resistor group 51c, a 52nd R-phase resistor group 52a, a 52nd S-phase resistor group 52b, a 52nd T-phase resistor group 52c, and a fifth switch group (a 53rd relay unit 53, a 54th relay unit 54, a 55th relay unit 55).

The configuration of the fifth resistance unit 50 is similar to the configuration of the first resistance unit (Sixth Resistance Unit 60)

The sixth resistance unit 60 has a 61st R-phase resistor group 61a, a 61st S-phase resistor group 61b, a 61st T-phase resistor group 61c, a 62nd R-phase resistor group 62a, a 62nd S-phase resistor group 62b, a 62nd T-phase resistor group 62c, and a sixth switch group (a 63rd relay unit 63, a 64th relay unit 64, a 65th relay unit 65).

The configuration of the sixth resistance unit 60 is similar to the configuration of the first resistance unit (Seventh Resistance Unit 70)

The seventh resistance unit 70 has a 71st R-phase resistor group 71a, a 71st S-phase resistor group 71b, a 71st T-phase resistor group 71c, a 72nd R-phase resistor group 72a, a 72nd S-phase resistor group 72b, a 72nd T-phase resistor group 72c, and a seventh switch group (a 73rd relay unit 73, a 74th relay unit 74, a 75th relay unit The configuration of the seventh resistance unit 70 is similar to the configuration of the first resistance unit (30th Resistance Unit 300)

The 30th resistance unit 300 has a 310th R-phase resistor group 310a, a 310th S-phase resistor group 310b, a 310th T-phase resistor group 310c, a 320th R-phase resistor group 320a, a 320th S-phase resistor group 320b, a 320th T-phase resistor group 320c, and a 30th switch group (a 340th R-phase relay 340a, a 340th S-phase relay 340b, a 340th T-phase relay 340c, a 350th R-phase relay 350a, a 350th S-phase relay 350b, a 350th T-phase relay 350c).

The configuration of the 30th resistance unit 300 is similar to the configuration of the 10th resistance unit 100.

(40th Resistance Unit 400)

The 40th resistance unit 400 has a 410th R-phase resistor group 410a, a 410th S-phase resistor group 410b, a 410th T-phase resistor group 410c, a 420th R-phase resistor group 420a, a 420th S-phase resistor group 420b, a 420th T-phase resistor group 420c, and a 40th switch group (a 440th R-phase relay 440a, a 440th S-phase relay 440b, a 440th T-phase relay 440c, a 450th R-phase relay 450a, a 450th S-phase relay 450b, a 450th T-phase relay 450c).

The configuration of the 40th resistance unit 400 is similar to the configuration of the 10th resistance unit 100.

(50th Resistance Unit 500)

The 50th resistance unit 500 has a 510th R-phase resistor group 510a, a 510th S-phase resistor group 510b, a 510th T-phase resistor group 510c, a 520th R-phase resistor group 520a, a 520th S-phase resistor group 520b, a 520th T-phase resistor group 520c, and a 50th switch group (a 540th R-phase relay 540a, a 540th S-phase relay 540b, a 540th T-phase relay 540c, a 550th R-phase relay 550a, a 550th S-phase relay 550b, a 550th T-phase relay 550c).

The configuration of the 50th resistance unit 500 is similar to the configuration of the 10th resistance unit 100.

(Effect of Sandwiching Region Including Resistor Group between Two Regions Including Relay)

By switching the connection state between the two resistor groups (such as the 11th R-phase resistor group 11a and the 12th R-phase resistor group 12a) between series and parallel, it is easy to cope with the load test of the high-voltage test target power supply and the load test of the low-voltage test target power supply. Meanwhile, in order to switch the connection state between the two resistor groups, it is necessary to prepare the switch group including a plurality of relays and relay units.

The regions (the first accommodation region 2a to the third accommodation region 2c) that accommodate the resistor group are sandwiched between the region (fourth accommodation region 2d) that accommodates the relay of the main relay unit (such as the third main relay unit 7) and some relays of the switch group (such as the 13th relay unit 13) and the region (fifth accommodation region 2e) that accommodates the remaining relays of the switch group (such as the 14th relay unit 14).

That is, the relays of the switch group are disposed on both sides of the regions (the first accommodation region 2a to the third accommodation region 2c) that accommodate the resistor group in the direction (x direction) in which the regions that accommodate said resistor group are arranged.

Therefore, as compared with a form in which the relay of the switch group and the like is disposed on one side of the regions (the first accommodation region 2a to the third accommodation region 2c) that accommodate the resistor group, it is possible to easily wire a cable that connects the resistor R of the resistor group and the relay, and the relay. Maintenance at the time of failure or the like is also facilitated.

(Effect of Disposing Resistor R so as to Extend in X Direction (Providing Rod-Shaped Resistor R Parallel to X Direction))

As compared with a form in which the resistor R is disposed to extend in the y direction, a cable length between the end of the resistor R and the relay of the fourth accommodation region 2d or the fifth accommodation region 2e can be shortened and the wiring can be easily performed.

(Effect of Connecting Odd Resistors R in Series)

As compared with the case where even resistors R are connected in series, the terminal of the resistor R closer to the fourth accommodation region 2d can be easily wired with the relay of the fourth accommodation region 2d, and the terminal of the resistor R closer to the fifth accommodation region 2e can be easily wired with the relay of the fifth accommodation region 2e.

(Effect of Switching Relay with Turning Off Power Supply)

Since the 14th relay unit 14 and the like is switched in a state where the power supply is cut off using the magnetic contactor such as the 13th relay unit 13, it is possible to prevent power supply to the resistor group or the like to which power should not be erroneously supplied.

(Effect of Sharing Short-Circuit Relay)

By sharing a short-circuit relay (the third main relay unit 7) for neutral point connection of star connection, the number of relays can be reduced as compared with a form in which a short-circuit relay for neutral point connection in the first resistance unit 10 and a short-circuit relay for neutral point connection in the second resistance unit 20 are separately provided.

Although some embodiments of the present invention have been described, these embodiments are presented as examples, and are not intended to limit the scope of the invention. These embodiments can be implemented in various other forms, and various omissions, substitutions, and changes can be made without departing from the gist of the invention. These embodiments and modifications thereof are included in the scope and gist of the invention, and included in the scope of the invention described in the claims and the equivalent scope thereof.

REFERENCE SIGNS LIST 1 load testing device
2 housing
2a first accommodation region (R-phase resistor group accommodation region)
2a1 11th accommodation region (first R-phase resistor group accommodation region)

2a2 12th accommodation region (second R-phase resistor group accommodation region)
2a11 first R-phase intake port
2a12 second R-phase intake port
2a21 first R-phase exhaust port
2a22 second R-phase exhaust port
2b second accommodation region (S-phase resistor group accommodation region)
2b1 21st accommodation region (first S-phase resistor group accommodation region)
2b2 22nd accommodation region (second S-phase resistor group accommodation region)
2b11 first S-phase intake port
2b12 second S-phase intake port
2b21 first S-phase exhaust port
2b22 second S-phase exhaust port
2c third accommodation region (T-phase resistor group accommodation region)
2c1 31st accommodation region (first T-phase resistor group accommodation region)
2c2 32nd accommodation region (second T-phase resistor group accommodation region)
2c11 first T-phase intake port
2c12 second T-phase intake port
2c21 first T-phase exhaust port
2c22 second T-phase exhaust port
2d fourth accommodation region (first relay unit accommodation region)
2e fifth accommodation region (second relay unit accommodation region) first main relay unit
6 second main relay unit (for low-voltage connection)
7 third main relay unit (for high-voltage connection, neutral point connection)
8 first fine-adjustment relay unit
9 second fine-adjustment relay unit first resistance unit
11a 11th R-phase resistor group
11b 11th S-phase resistor group
11c 11th T-phase resistor group
12a 12th R-phase resistor group
12b 12th S-phase resistor group
12c 12th T-phase resistor group
13 13th relay unit
14 14th relay unit (for first resistance unit low-voltage neutral point connection)
15 15th relay unit second resistance unit
21a 21st R-phase resistor group
21b 21st S-phase resistor group
21c 21st T-phase resistor group
22a 22nd R-phase resistor group
22b 22nd S-phase resistor group
22c 22nd T-phase resistor group
23 23rd relay unit
24 24th relay unit (for second resistance unit low-voltage neutral point connection)
25 25th relay unit third resistance unit
31a 31st R-phase resistor group
31b 31st S-phase resistor group
31c 31st T-phase resistor group
32a 32nd R-phase resistor group
32b 32nd S-phase resistor group
32c 32nd T-phase resistor group
33 33rd relay unit
34 34 relay unit (for third resistance unit low-voltage neutral point connection)
35 35th relay unit
40 fourth resistance unit
41a 41st R-phase resistor group
41b 41st S-phase resistor group
41c 41st T-phase resistor group
42a 42nd R-phase resistor group
42b 42nd S-phase resistor group
42c 42nd T-phase resistor group
43 43rd relay unit
44 44th relay unit (for fourth resistance unit low-voltage neutral point connection)
45 45th relay unit fifth resistance unit
51a 51st R-phase resistor group
51b 51st S-phase resistor group
51c 51st T-phase resistor group
52a 52nd R-phase resistor group
52b 52nd S-phase resistor group
52c 52nd T-phase resistor group
53 53rd relay unit
54 54th relay unit (for fifth resistance unit low-voltage neutral point connection)
55 55th relay unit
60 sixth resistance unit
61a 61st R-phase resistor group
61b 61st S-phase resistor group
61c 61st T-phase resistor group
62a 62nd R-phase resistor group
62b 62nd S-phase resistor group
62c 62nd T-phase resistor group
63 63rd relay unit
64 64th relay unit (for sixth resistance unit low-voltage neutral point connection)
65 65th relay unit seventh resistance unit
71a 71st R-phase resistor group
71b 71st S-phase resistor group
71c 71st T-phase resistor group
72a 72nd R-phase resistor group
72b 72nd S-phase resistor group
72c 72nd T-phase resistor group
73 73rd relay unit
74 74th relay unit (for seventh resistance unit low-voltage neutral point connection)
75 75th relay unit
80 cooling unit
81a first R-phase cooling unit
82a second R-phase cooling unit
81b first S-phase cooling unit
82b second S-phase cooling unit
81c first T-phase cooling unit
82c second T-phase cooling unit
91 operation unit
93 terminal unit
100 10th resistance unit
110a 110th R-phase resistor group
110b 110th S-phase resistor group
110c 110th T-phase resistor group
120a 120th R-phase resistor group
120b 120th S-phase resistor group
120c 120th T-phase resistor group
140a 140th R-phase relay (for 10th resistance unit low-voltage neutral point connection)
140b 140th S-phase relay (for 10th resistance unit low-voltage neutral point connection)
140c 140th T-phase relay (for 10th resistance unit low-voltage neutral point connection)
150a 150th R-phase relay
150b 150th S-phase relay
150c 150th T-phase relay
200 20th resistance unit
210a 210th R-phase resistor group 210*b* 210th S-phase resistor group
210*c* 210th T-phase resistor group
220*a* 220th R-phase resistor group
220*b* 220th S-phase resistor group
220*c* 220th T-phase resistor group
240*a* 240th R-phase relay (for 20th resistance unit low-voltage neutral point connection)
240*b* 240th S-phase relay (for 20th resistance unit low-voltage neutral point connection)
240*c* 240th T-phase relay (for 20th resistance unit low-voltage neutral point connection)
250*a* 250th R-phase relay
250*b* 250th S-phase relay
250*c* 250th T-phase relay
300 30th resistance unit
310*a* 310th R-phase resistor group
310*b* 310th S-phase resistor group
310*c* 310th T-phase resistor group
320*a* 320th R-phase resistor group
320*b* 320th S-phase resistor group
320*c* 320th T-phase resistor group
340*a* 340th R-phase relay (for 30th resistance unit low-voltage neutral point connection)
340*b* 340th S-phase relay (for 30th resistance unit low-voltage neutral point connection)
340*c* 340th T-phase relay (for 30th resistance unit low-voltage neutral point connection)
350*a* 350th R-phase relay
350*b* 350th S-phase relay
350*c* 350th T-phase relay
400 40th resistance unit
410*a* 410th R-phase resistor group
410*b* 410th S-phase resistor group
410*c* 410th T-phase resistor group
420*a* 420th R-phase resistor group
420*b* 420th S-phase resistor group
420*c* 420th T-phase resistor group
440*a* 440th R-phase relay (for 40th resistance unit low-voltage neutral point connection)
440*b* 440th S-phase relay (for 40th resistance unit low-voltage neutral point connection)
440*c* 440th T-phase relay (for 40th resistance unit low-voltage neutral point connection)
450*a* 450th R-phase relay
450*b* 450th S-phase relay
450*c* 450th T-phase relay
500 50th resistance unit
510*a* 510th R-phase resistor group
510*b* 510th S-phase resistor group
510*c* 510th T-phase resistor group
520*a* 520th R-phase resistor group
520*b* 520th S-phase resistor group
520*c* 520th T-phase resistor group
540*a* 540th R-phase relay (for 50th resistance unit low-voltage neutral point connection)
540*b* 540th S-phase relay (for 50th resistance unit low-voltage neutral point connection)
540*c* 540th T-phase relay (for 50th resistance unit low-voltage neutral point connection)
550*a* 550th R-phase relay
550*b* 550th S-phase relay
550*c* 550th T-phase relay

The invention claimed is:

1. A load testing device comprising:
a terminal unit connected to a test target power supply;
a main relay unit;
a resistance unit including a first R-phase resistor group, a second R-phase resistor group, a first S-phase resistor group, a second S-phase resistor group, a first T-phase resistor group, a second T-phase resistor group, and a switch group; and
a housing that accommodates the terminal unit and the resistance unit,
wherein:
each of the first R-phase resistor group, the second R-phase resistor group, the first S-phase resistor group, the second S-phase resistor group, the first T-phase resistor group, and the second T-phase resistor group includes at least one resistor;
the main relay unit and the switch group are used to switch a connection state between the first R-phase resistor group and the second R-phase resistor group between series and parallel, switch a connection state between the first S-phase resistor group and the second S-phase resistor group between series and parallel, and switch a connection state between the first T-phase resistor group and the second T-phase resistor group between series and parallel;
power from an R-phase terminal of the test target power supply is supplied to the first R-phase resistor group and the second R-phase resistor group via the terminal unit;
power from an S-phase terminal of the test target power supply is supplied to the first S-phase resistor group and the second S-phase resistor group via the terminal unit;
power from a T-phase terminal of the test target power supply is supplied to the first T-phase resistor group and the second T-phase resistor group via the terminal unit;
a first accommodation region, a second accommodation region, and a third accommodation region in the housing are located between a fourth accommodation region and a fifth accommodation region in the housing;
the second accommodation region is located between the first accommodation region and the third accommodation region;
the first accommodation region accommodates the first R-phase resistor group and the second R-phase resistor group;
the second accommodation region accommodates the first S-phase resistor group and the second S-phase resistor group;
the third accommodation region accommodates the first T-phase resistor group and the second T-phase resistor group;
the fourth accommodation region accommodates the terminal unit, a relay of the main relay unit, and some relays of the switch group; and
the fifth accommodation region accommodates remaining relays of the switch group.

2. The load testing device according to claim 1, wherein:
one terminal of the first R-phase resistor group and one terminal of the second R-phase resistor group are connected;
one terminal of the first S-phase resistor group and one terminal of the second S-phase resistor group are connected;
one terminal of the first T-phase resistor group and one terminal of the second T-phase resistor group are connected; and
the remaining relays of the switch group include a relay for connecting one terminal of the first R-phase resistor group, one terminal of the first S-phase resistor group, and one terminal of the first T-phase resistor group when the first R-phase resistor group and the second R-phase resistor group are connected in parallel, the first S-phase resistor group and the second S-phase resistor group are connected in parallel, and the first T-phase resistor group and the second T-phase resistor group are connected in parallel.

3. The load testing device according to claim 2, wherein the main relay unit includes a relay for connecting the other terminal of the second R-phase resistor group, the other terminal of the second S-phase resistor group, and the other terminal of the second T-phase resistor group when the first R-phase resistor group and the second R-phase resistor group are connected in series, the first S-phase resistor group and the second S-phase resistor group are connected in series, and the first T-phase resistor group and the second T-phase resistor group are connected in series, and includes a relay for connecting the other terminal of the first R-phase resistor group and the other terminal of the second R-phase resistor group, connecting the other terminal of the first S-phase resistor group and the other terminal of the second S-phase resistor group, and connecting the other terminal of the first T-phase resistor group and the other terminal of the second T-phase resistor group.

4. The load testing device according to claim 1, wherein:
the fourth accommodation region, the first accommodation region, the second accommodation region, the third accommodation region, and the fifth accommodation region are arranged in a first direction;
a region that accommodates the first R-phase resistor group in the first accommodation region and a region that accommodates the second R-phase resistor group in the first accommodation region are arranged in a second direction perpendicular to the first direction;
a region that accommodates the first S-phase resistor group in the second accommodation region and a region that accommodates the second S-phase resistor group in the second accommodation region are arranged in the second direction;
a region that accommodates the first T-phase resistor group in the third accommodation region and a region that accommodates the second T-phase resistor group in the third accommodation region are arranged in the second direction; and
resistors of the first R-phase resistor group, the second R-phase resistor group, the first S-phase resistor group, the second S-phase resistor group, the first T-phase resistor group, and the second T-phase resistor group are disposed to extend in the first direction.

5. The load testing device according to claim 1, wherein:
the fourth accommodation region, the first accommodation region, the second accommodation region, the third accommodation region, and the fifth accommodation region are arranged in a first direction;
a region that accommodates the first R-phase resistor group in the first accommodation region and a region that accommodates the second R-phase resistor group in the first accommodation region are arranged in a second direction perpendicular to the first direction;
a region that accommodates the first S-phase resistor group in the second accommodation region and a region that accommodates the second S-phase resistor group in the second accommodation region are arranged in the second direction;
a region that accommodates the first T-phase resistor group in the third accommodation region and a region that accommodates the second T-phase resistor group in the third accommodation region are arranged in the second direction;
odd resistors of the first R-phase resistor group, the second R-phase resistor group, the first S-phase resistor group, the second S-phase resistor group, the first T-phase resistor group, and the second T-phase resistor group are connected in series and disposed to extend in the first direction;
the resistors of the first R-phase resistor group and the second R-phase resistor group are arranged in the second direction;
the resistors of the first S-phase resistor group and the second S-phase resistor group are arranged in the second direction; and
the resistors of the first T-phase resistor group and the second T-phase resistor group are arranged in the second direction.

6. The load testing device according to claim 1, wherein:
the fourth accommodation region, the first accommodation region, the second accommodation region, the third accommodation region, and the fifth accommodation region are arranged in a first direction;
a region that accommodates the first R-phase resistor group in the first accommodation region and a region that accommodates the second R-phase resistor group in the first accommodation region are arranged in a second direction perpendicular to the first direction;
a region that accommodates the first S-phase resistor group in the second accommodation region and a region that accommodates the second S-phase resistor group in the second accommodation region are arranged in the second direction;
a region that accommodates the first T-phase resistor group in the third accommodation region and a region that accommodates the second T-phase resistor group in the third accommodation region are arranged in the second direction;
odd resistors of the first R-phase resistor group, the second R-phase resistor group, the first S-phase resistor group, the second S-phase resistor group, the first T-phase resistor group, and the second T-phase resistor group are connected in series and disposed to extend in the second direction;
the resistors of the first R-phase resistor group and the second R-phase resistor group are arranged in the first direction;
the resistors of the first S-phase resistor group and the second S-phase resistor group are arranged in the first direction; and
the resistors of the first T-phase resistor group and the second T-phase resistor group are arranged in the first direction.

7. A load testing device comprising:
a terminal unit connected to a test target power supply;
a main relay unit;
a first resistance unit including a 11th R-phase resistor group, a 12th R-phase resistor group, a 11th S-phase resistor group, a 12th S-phase resistor group, a 11th T-phase resistor group, a 12th T-phase resistor group, and a first switch group;

a second resistance unit including a 21st R-phase resistor group, a 22nd R-phase resistor group, a 21st S-phase resistor group, a 22nd S-phase resistor group, a 21st T-phase resistor group, a 22nd T-phase resistor group, and a second switch group; and a housing that accommodates the terminal unit, the first resistance unit, and the second resistance unit, wherein:

each of the 11th R-phase resistor group, the 12th R-phase resistor group, the 11th S-phase resistor group, the 12th S-phase resistor group, the 11th T-phase resistor group, the 12th T-phase resistor group, the 21st R-phase resistor group, the 22nd R-phase resistor group, the 21st S-phase resistor group, the 22nd S-phase resistor group, the 21st T-phase resistor group, and the 22nd T-phase resistor group includes at least one resistor;

the main relay unit and the first switch group are used to switch a connection state between the 11th R-phase resistor group and the 12th R-phase resistor group between series and parallel, switch a connection state between the 11th S-phase resistor group and the 12th S-phase resistor group between series and parallel, and switch a connection state between the 11th T-phase resistor group and the 12th T-phase resistor group between series and parallel;

the main relay unit and the second switch group are used to switch a connection state between the 21st R-phase resistor group and the 22nd R-phase resistor group between series and parallel, switch a connection state between the 21st S-phase resistor group and the 22nd S-phase resistor group between series and parallel, and switch a connection state between the 21st T-phase resistor group and the 22nd T-phase resistor group between series and parallel;

power from an R-phase terminal of the test target power supply is supplied to the 11th R-phase resistor group, the 12th R-phase resistor group, the 21st R-phase resistor group, and the 22nd R-phase resistor group via the terminal unit;

power from an S-phase terminal of the test target power supply is supplied to the 11th S-phase resistor group, the 12th S-phase resistor group, the 21st S-phase resistor group, and the 22nd S-phase resistor group via the terminal unit;

power from a T-phase terminal of the test target power supply is supplied to the 11th T-phase resistor group, the 12th T-phase resistor group, the 21st T-phase resistor group, and the 22nd T-phase resistor group via the terminal unit;

a first accommodation region, a second accommodation region, and a third accommodation region in the housing are located between a fourth accommodation region and a fifth accommodation region in the housing;

the second accommodation region is located between the first accommodation region and the third accommodation region;

the first accommodation region accommodates the 11th R-phase resistor group, the 12th R-phase resistor group, the 21st R-phase resistor group, and the 22nd R-phase resistor group;

the second accommodation region accommodates the 11th S-phase resistor group, the 12th S-phase resistor group, the 21st S-phase resistor group, and the 22nd S-phase resistor group;

the third accommodation region accommodates the 11th T-phase resistor group, the 12th T-phase resistor group, the 21st T-phase resistor group, and the 22nd T-phase resistor group;

the fourth accommodation region accommodates the terminal unit, a relay of the main relay unit, at least some relays of the first switch group, and at least some relays of the second switch group; and the fifth accommodation region accommodates at least one of remaining relays of the first switch group and remaining relays of the second switch group.

8. The load testing device according to claim 7, wherein:

one terminal of the 11th R-phase resistor group and one terminal of the 12 the R-phase resistor group are connected;

one terminal of the 11th S-phase resistor group and one terminal of the 12th S-phase resistor group are connected;

one terminal of the 11th T-phase resistor group and one terminal of the 12th T-phase resistor group are connected;

one terminal of the 21st R-phase resistor group and one terminal of the 22nd R-phase resistor group are connected;

one terminal of the 21st S-phase resistor group and one terminal of the 22nd S-phase resistor group are connected;

one terminal of the 21st T-phase resistor group and one terminal of the 22nd T-phase resistor group are connected;

the remaining relays of the first switch group include a relay for connecting one terminal of the 11th R-phase resistor group, one terminal of the 11th S-phase resistor group, and one terminal of the 11th T-phase resistor group when the 11th R-phase resistor group and the 12th R-phase resistor group are connected in parallel, the 11th S-phase resistor group and the 12th S-phase resistor group are connected in parallel, and the 11th T-phase resistor group and the 12th T-phase resistor group are connected in parallel; and the remaining relays of the second switch group include a relay for connecting one terminal of the 21st R-phase resistor group, one terminal of the 21st S-phase resistor group, and one terminal of the 21st T-phase resistor group when the 21st R-phase resistor group and the 22nd R-phase resistor group are connected in parallel, the 21st S-phase resistor group and the 22nd S-phase resistor group are connected in parallel, and the 21st T-phase resistor group and the 22nd T-phase resistor group are connected in parallel.

9. The load testing device according to claim 7, wherein:

a connection state between the 11th R-phase resistor group and the 12th R-phase resistor group, a connection state between the 11th S-phase resistor group and the 12th S-phase resistor group, and a connection state between the 11th T-phase resistor group and the 12th T-phase resistor group are switched in a state where power supply from the test target power supply to the first resistance unit via the terminal unit is not performed; and a connection state between the 21st R-phase resistor group and the 22nd R-phase resistor group, a connection state between the 21st S-phase resistor group and the 22nd S-phase resistor group, and a connection state between the 21st T-phase resistor group and the 22nd T-phase resistor group are switched in a state where power supply from the test target power supply to the second resistance unit via the terminal unit is not performed.

10. The load testing device according to claim 7, wherein;
one terminal of the 11th R-phase resistor group and one terminal of the 12th R-phase resistor group are connected;
one terminal of the 11th S-phase resistor group and one terminal of the 12th S-phase resistor group are connected;
one terminal of the 11th T-phase resistor group and one terminal of the 12th T-phase resistor group are connected;
one terminal of the 21st R-phase resistor group and one terminal of the 22nd R-phase resistor group are connected;
one terminal of the 21st S-phase resistor group and one terminal of the 22nd S-phase resistor group are connected;
one terminal of the 21st T-phase resistor group and one terminal of the 22nd T-phase resistor group are connected; and
at least one of the remaining relays of the first switch group and the remaining relays of the second switch group which is accommodated in the fifth accommodation region, includes a relay for connecting one terminal of the 11th R-phase resistor group, one terminal of the 11th S-phase resistor group, and one terminal of the 11th T-phase resistor group, and for connecting one terminal of the 21st R-phase resistor group, one terminal of the 21st S-phase resistor group, and one terminal of the 21st T-phase resistor group when the 11th R-phase resistor group and the 12th R-phase resistor group are connected in parallel, the 11th S-phase resistor group and the 12th S-phase resistor group are connected in parallel, the 11th T-phase resistor group and the 12th T-phase resistor group are connected in parallel, the 21st R-phase resistor group and the 22nd R-phase resistor group are connected in parallel, the 21st S-phase resistor group and the 22nd S-phase resistor group are connected in parallel, and the 21st T-phase resistor group and the 22nd T-phase resistor group are connected in parallel.

11. The load testing device according to claim 10, wherein:
when the 11th R-phase resistor group and the 12th R-phase resistor group are connected in parallel, the 11th S-phase resistor group and the 12th S-phase resistor group are connected in parallel, the 11th T-phase resistor group and the 12th T-phase resistor group are connected in parallel, the 21st R-phase resistor group and the 22nd R-phase resistor group are connected in parallel, the 21st S-phase resistor group and the 22nd S-phase resistor group are connected in parallel, and the 21st T-phase resistor group and the 22nd T-phase resistor group are connected in parallel, the main relay unit includes a relay for connecting the other terminal of the 11th R-phase resistor group and the other terminal of the 12th R-phase resistor group, connecting the other terminal of the 11th S-phase resistor group and the other terminal of the 12th S-phase resistor group, connecting the other terminal of the 11th T-phase resistor group and the other terminal of the 12th T-phase resistor group, connecting the other terminal of the 21st R-phase resistor group and the other terminal of the 22nd R-phase resistor group, connecting the other terminal of the 21st S-phase resistor group and the other terminal of the 22nd S-phase resistor group, and connecting the other terminal of the 21st T-phase resistor group and the other terminal of the 22nd T-phase resistor group; and
when the 11th R-phase resistor group and the 12th R-phase resistor group are connected in series, the 11th S-phase resistor group and the 12th S-phase resistor group are connected in series, the 11th T-phase resistor group and the 12th T-phase resistor group are connected in series, the 21st R-phase resistor group and the 22nd R-phase resistor group are connected in series, the 21st S-phase resistor group and the 22nd S-phase resistor group are connected in series, and the 21st T-phase resistor group and the 22nd T-phase resistor group are connected in series, the main relay unit includes a relay for connecting the other terminal of the 12th R-phase resistor group, the other terminal of the 12th S-phase resistor group, the other terminal of the 12th T-phase resistor group, the other terminal of the 22nd R-phase resistor group, the other terminal of the 22nd S-phase resistor group, and the other terminal of the 22nd T-phase resistor group.

12. The load testing device according to claim 10, wherein a connection state between the 11th R-phase resistor group and the 12th R-phase resistor group, a connection state between the 11th S-phase resistor group and the 12th S-phase resistor group, a connection state between the 11th T-phase resistor group and the 12th T-phase resistor group, a connection state between the 21st R-phase resistor group and the 22nd R-phase resistor group, a connection state between the 21st S-phase resistor group and the 22nd S-phase resistor group, and a connection state between the 21st T-phase resistor group and the 22nd T-phase resistor group are switched in a state where power is not supplied from the test target power supply to the first resistance unit and the second resistance unit via the terminal unit.

* * * * *